(12) United States Patent
Li et al.

(10) Patent No.: US 11,756,630 B2
(45) Date of Patent: Sep. 12, 2023

(54) OBTAINING THRESHOLD VOLTAGE MEASUREMENTS FOR MEMORY CELLS BASED ON A USER READ MODE

(71) Applicant: Western Digital Technologies, Inc., San Jose, CA (US)

(72) Inventors: Liang Li, Shanghai (CN); Qianqian Yu, Shanghai (CN); Jiahui Yuan, Fremont, CA (US); Loc Tu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 162 days.

(21) Appl. No.: 17/400,609

(22) Filed: Aug. 12, 2021

(65) Prior Publication Data

US 2023/0048326 A1    Feb. 16, 2023

(51) Int. Cl.
| | |
|---|---|
| G11C 7/00 | (2006.01) |
| G11C 16/26 | (2006.01) |
| G11C 16/04 | (2006.01) |
| G11C 11/56 | (2006.01) |
| H10B 41/27 | (2023.01) |
| H10B 43/27 | (2023.01) |

(52) U.S. Cl.
CPC .......... *G11C 16/26* (2013.01); *G11C 11/5642* (2013.01); *G11C 11/5671* (2013.01); *G11C 16/0483* (2013.01); *H10B 41/27* (2023.02); *H10B 43/27* (2023.02)

(58) Field of Classification Search
CPC ....... G11C 7/1051; G11C 7/11; G11C 7/1072; G11C 7/1006; G11C 7/1066

USPC ........................................ 365/189.15, 189.14
See application file for complete search history.

(56) References Cited

U.S. PATENT DOCUMENTS

| | | | |
|---|---|---|---|
| 7,613,045 B2 | 11/2009 | Murin et al. | |
| 9,349,478 B2 | 5/2016 | Yuan et al. | |
| 9,595,345 B2 | 3/2017 | Mui et al. | |
| 9,697,905 B2 | 7/2017 | Sharon et al. | |
| 11,049,547 B1* | 6/2021 | Lee ........................ | G11C 16/28 |
| 2008/0285351 A1 | 11/2008 | Shlick et al. | |
| 2013/0329493 A1 | 12/2013 | Dutta et al. | |
| 2018/0277226 A1 | 9/2018 | Tokutomi et al. | |
| 2019/0043590 A1 | 2/2019 | Besinga et al. | |

(Continued)

OTHER PUBLICATIONS

U.S. Appl. No. 17/213,997, filed Mar. 26, 2021.

(Continued)

*Primary Examiner* — Son T Dinh
(74) *Attorney, Agent, or Firm* — Vierra Magen Marcus LLP

(57) ABSTRACT

Apparatuses and techniques are described for obtaining a threshold voltage distribution for a set of memory cells based on a user read mode. The user read mode can be based on various factors including a coding of a page and an increasing or decreasing order of the read voltages. The read process for the Vth distribution is made to mimic the read mode which is used when the memory device is in the hands of the end user. This results in a Vth distribution which reflects the user's experience to facilitate troubleshooting. In some cases, one or more dummy read operations are performed, where the read result is discarded, prior to a read operation which is used to build the Vth distribution.

20 Claims, 24 Drawing Sheets

(56) References Cited

U.S. PATENT DOCUMENTS

2019/0206457 A1 7/2019 Park et al.
2019/0318792 A1* 10/2019 Yang .................. G11C 11/5642

OTHER PUBLICATIONS

International Search Report and the Written Opinion of the International Searching Authority dated Sep. 13, 2022, International Patent Application No. PCT/US2022/027547.

* cited by examiner

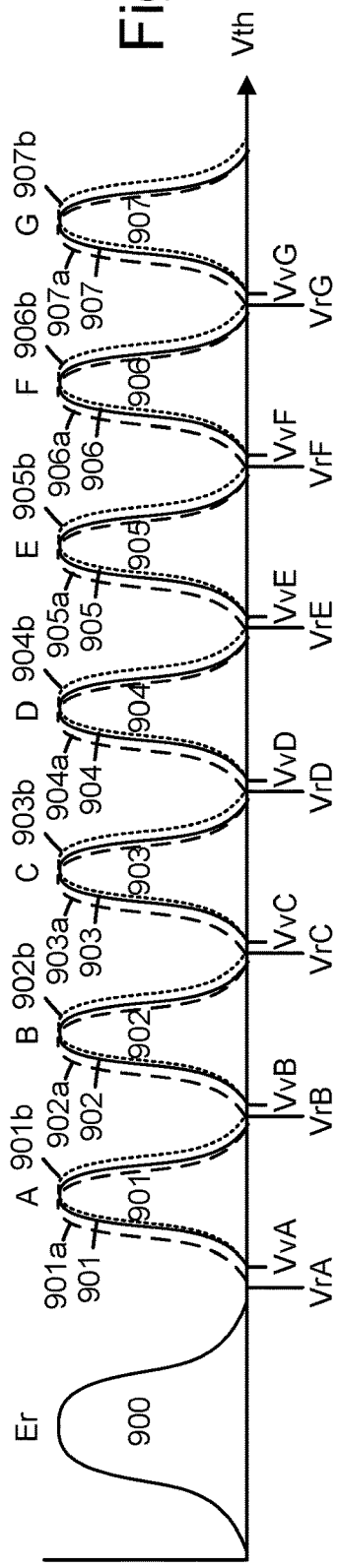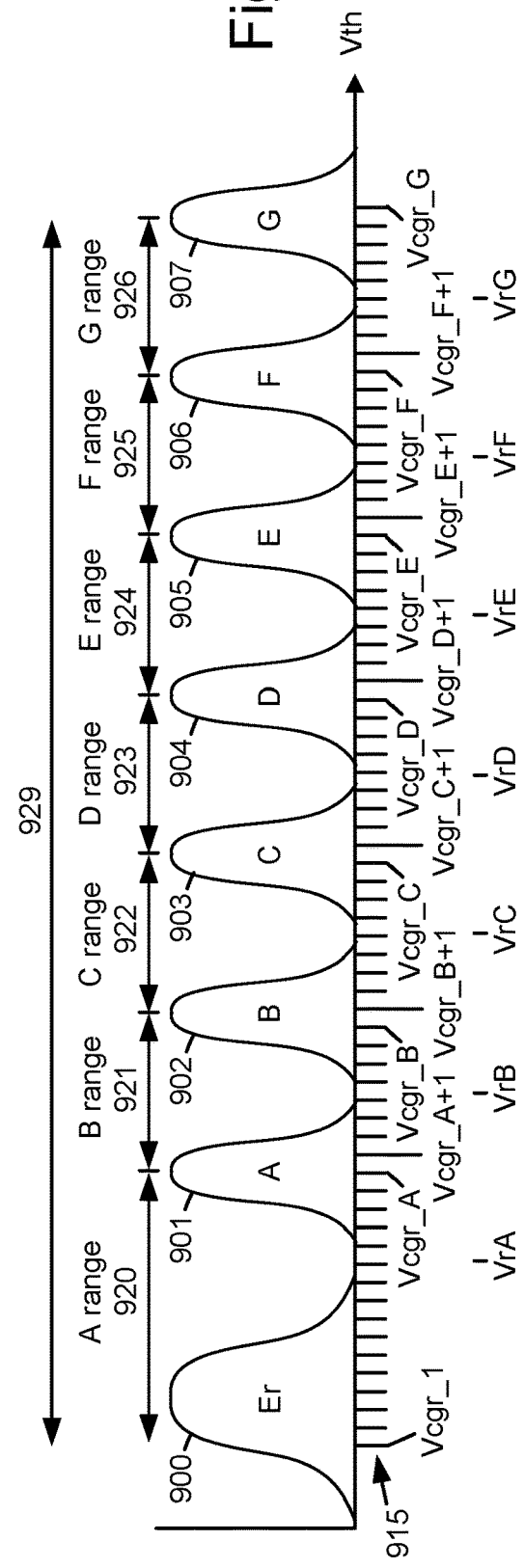

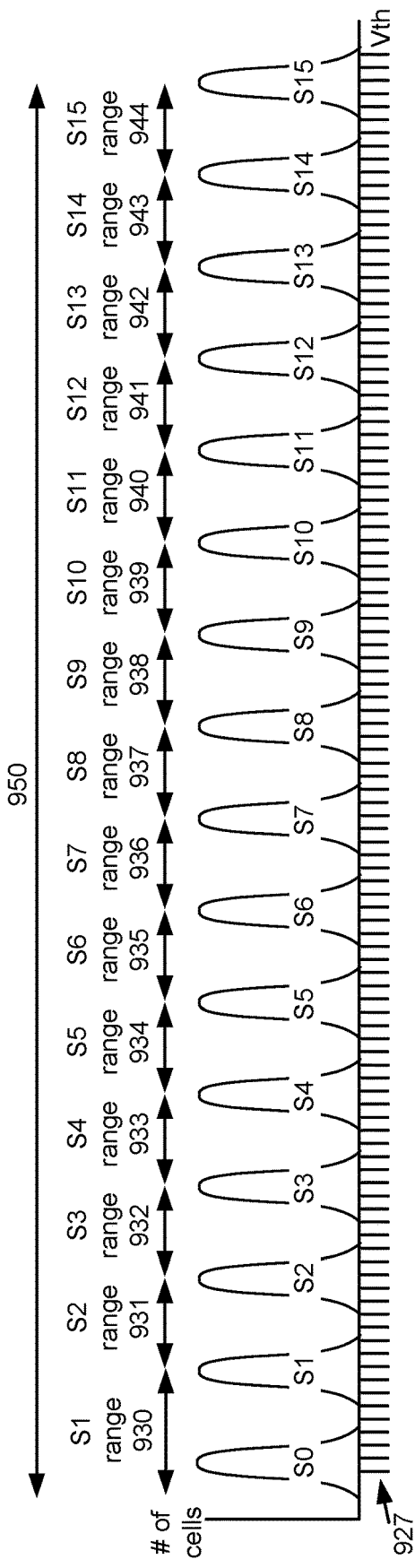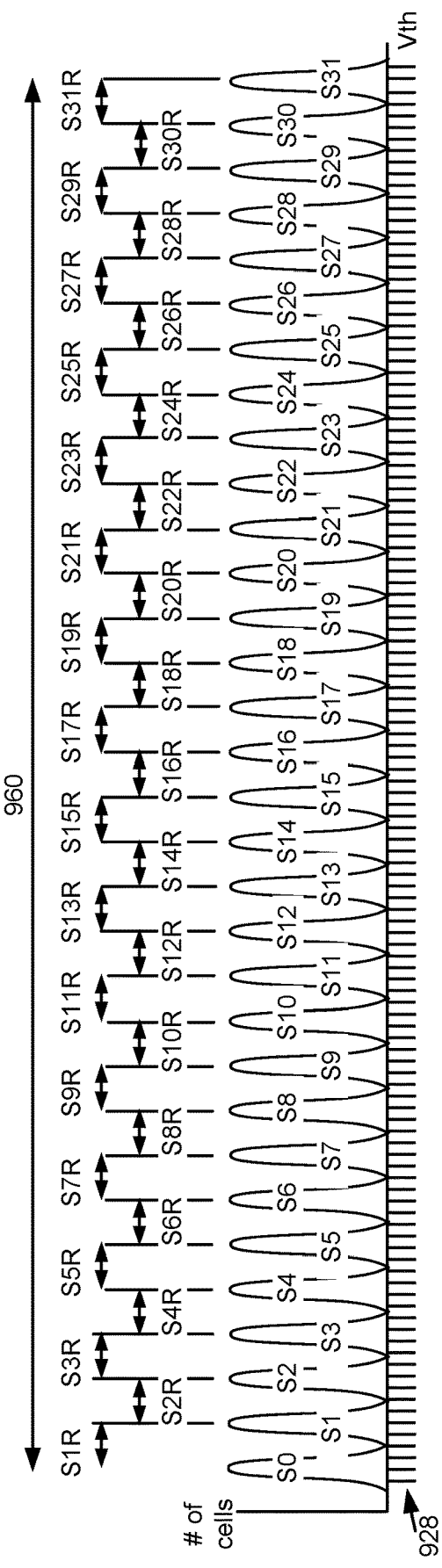

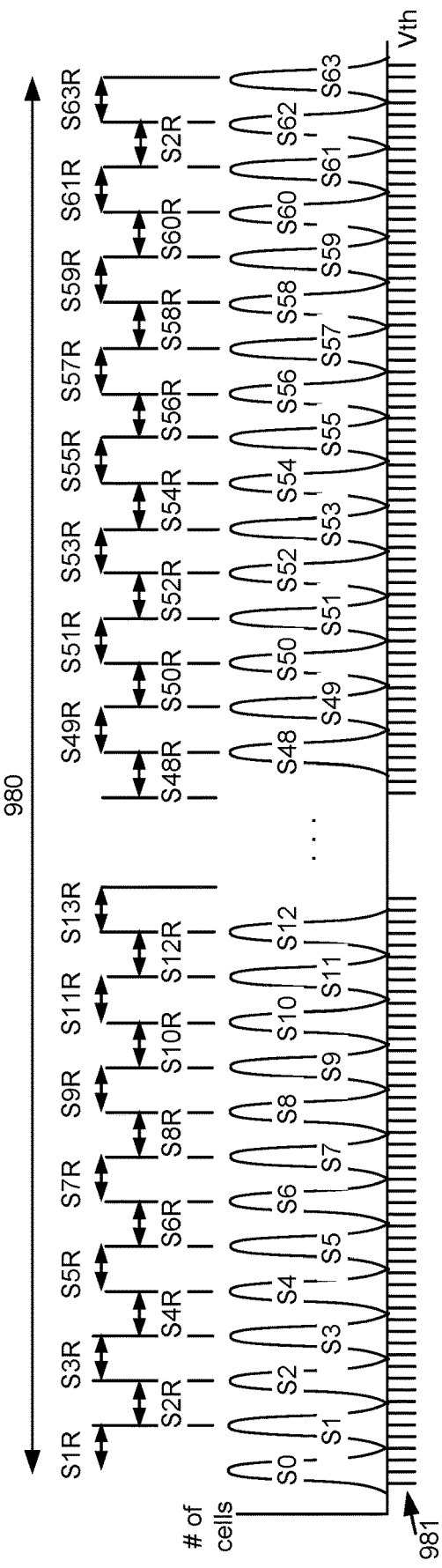

| Page | Er | A | B | C | D | E | F | G |
|---|---|---|---|---|---|---|---|---|
| UP | 1 | 0 | 1 | 0 | 1 | 0 | 1 | 0 |
| MP | 1 | 1 | 0 | 0 | 1 | 1 | 0 | 0 |
| LP | 1 | 1 | 1 | 1 | 0 | 0 | 0 | 0 |

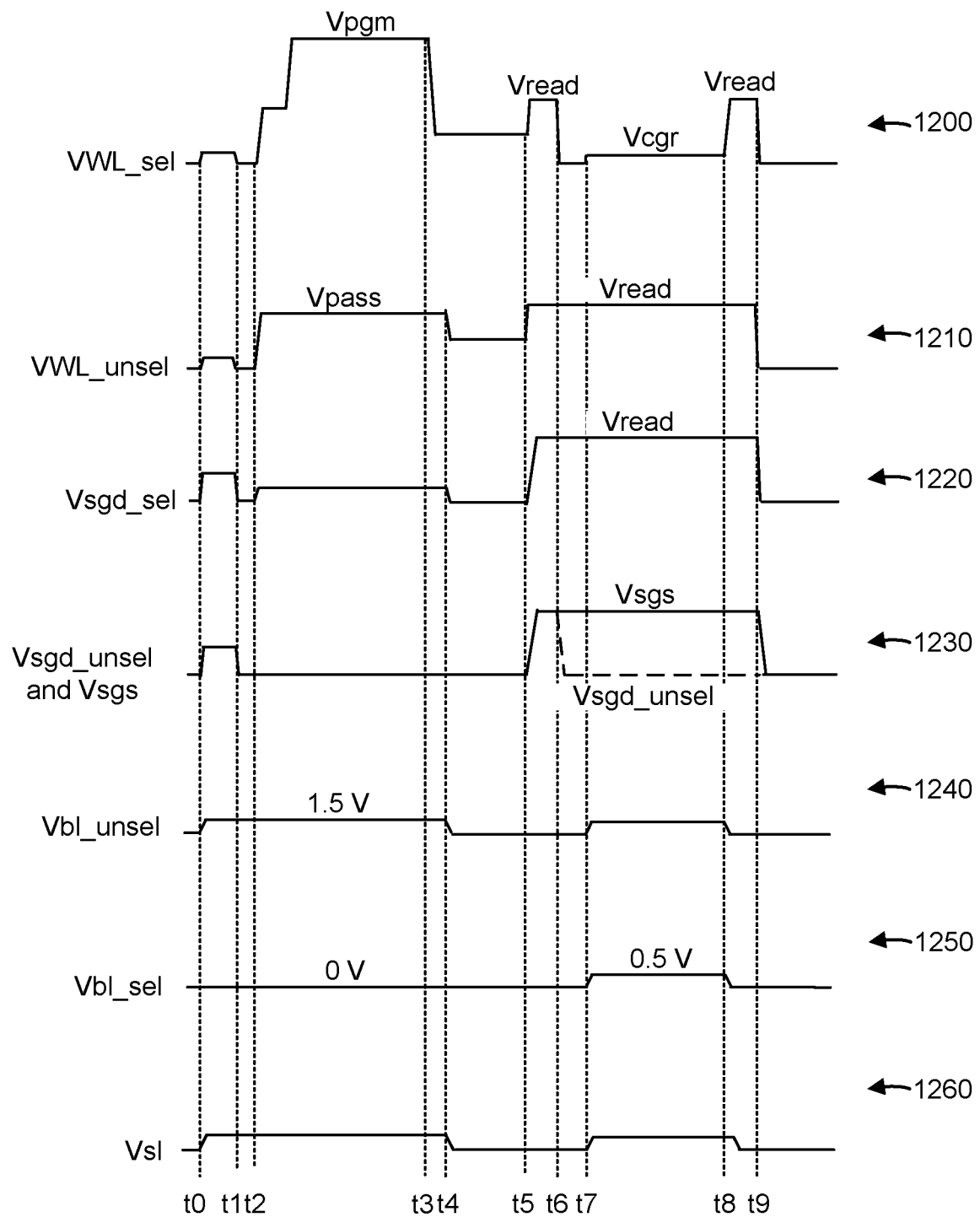

Fig. 14A

| Range of Vcgr: | Voltage signal type: Increasing | Example | Decreasing | Example |
|---|---|---|---|---|
| A range | Type 1 | 1 | Type 3 | 8 |
| B range | Type 1 | 2 | Type 3 | 9 |
| C range | Type 2 | 3 | Type 2 | 10 |
| D range | Type 1 | 4 | Type 1 | 4 |
| E range | Type 2 | 5 | Type 2 | 11 |
| F range | Type 3 | 6 | Type 1 | 12 |
| G range | Type 3 | 7 | Type 1 | 13 |

3 bits per cell; 1-3-3 page coding

Fig. 14B

| Range of Vcgr: | Voltage signal type: Increasing | Example | Decreasing | Example |
|---|---|---|---|---|
| A range | Type 1 | 1 | Type 2 | 19 |
| B range | Type 1 | 2 | Type 3 | 20 |
| C range | Type 1 | 14 | Type 2 | 21 |
| D range | Type 2 | 15 | Type 2 | 22 |
| E range | Type 2 | 16 | Type 1 | 23 |
| F range | Type 3 | 17 | Type 1 | 12 |
| G range | Type 2 | 18 | Type 1 | 13 |

3 bits per cell; 2-3-2 page coding

Fig. 14C 3 bits per cell; 1-3-3 page coding

|    | Increasing | Decreasing |
|----|------------|------------|
| LP | Example 4  | Example 4  |
| MP | Example 6  | Example 8  |
| UP | Example 7  | Example 9  |

Fig. 14D 3 bits per cell; 2-3-2 page coding

|    | Increasing  | Decreasing  |
|----|-------------|-------------|
| LP | Example 5   | Example 19  |
| MP | Example 17  | Example 20  |
| UP | Example 18  | Example 21  |

Fig. 15A
Type 1

| Read voltage; use sensing result for Vth distribution   1500 |
|---|

Fig. 15B
Type 2

| Dummy read voltage; discard sensing results   1510 | Read voltage; use sensing result for Vth distribution   1511 |
|---|---|

Fig. 15C
Type 3

| Dummy read voltage; discard sensing results   1520 | Dummy read voltage; discard sensing results   1521 | Read voltage; use sensing result for Vth distribution   1522 |
|---|---|---|

Example 1

Example 2

Example 3

Example 4

Example 5

Example 6

Example 7

Example 8

Example 9

Example 10

Example 11

Example 12

Example 13

Example 14

Example 15

Example 16

Example 17

Example 18

Example 19

Example 20

Example 21

Example 22

Example 23

OBTAINING THRESHOLD VOLTAGE MEASUREMENTS FOR MEMORY CELLS BASED ON A USER READ MODE

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 9A depicts an example threshold voltage (Vth) distribution of a set of memory cells, with three bits per cell, and data state demarcation voltages for distinguishing between data states, indicating how the Vth can vary based on the read process.

FIG. 9B depicts example read voltages in a process for measuring the Vth distribution of FIG. 9A, where each read voltage is in a voltage range and each voltage range encompasses one of the data state demarcation voltages of FIG. 9A.

FIG. 9C depicts an example Vth distribution of a set of memory cells, with four bits per cell, and example voltage ranges in a process for measuring the Vth distribution.

FIG. 9D depicts an example Vth distribution of a set of memory cells, with five bits per cell, and example voltage ranges in a process for measuring the Vth distribution.

FIG. 9E depicts an example Vth distribution of a set of memory cells, with six bits per cell, and example voltage ranges in a process for measuring the Vth distribution.

FIG. 12 depicts example plots for various voltage signals in a program loop consistent with FIG. 10.

FIG. 14A depicts an example table which cross-references a range of read voltages, Vcgr, consistent with FIGS. 9B and 13C, to a type of voltage signal, for three bits per cell and a 1-3-3 page coding.

FIG. 14B depicts an example table which cross-references a range of read voltages, Vcgr, consistent with FIGS. 9B and 13C, to a type of voltage signal, for three bits per cell and a 2-3-2 page coding.

FIG. 14C depicts an example table which cross-references a read operation in a user read mode to one of the examples of FIG. 14A, for a lower page (LP), a middle page (MP) and an upper page (UP) of a 1-3-3 page coding.

FIG. 14D depicts an example table which cross-references a read operation in a user read mode to one of the examples of FIG. 14B, for a lower page (LP), a middle page (MP) and an upper page (UP) of a 2-3-2 page coding.

FIG. 15A depicts an example of a first type of voltage signal, consistent with FIGS. 14A and 14B.

FIG. 15B depicts an example of a second type of voltage signal, consistent with FIGS. 14A and 14B.

FIG. 15C depicts an example of a third type of voltage signal, consistent with FIGS. 14A and 14B.

DETAILED DESCRIPTION

Figure 1A:
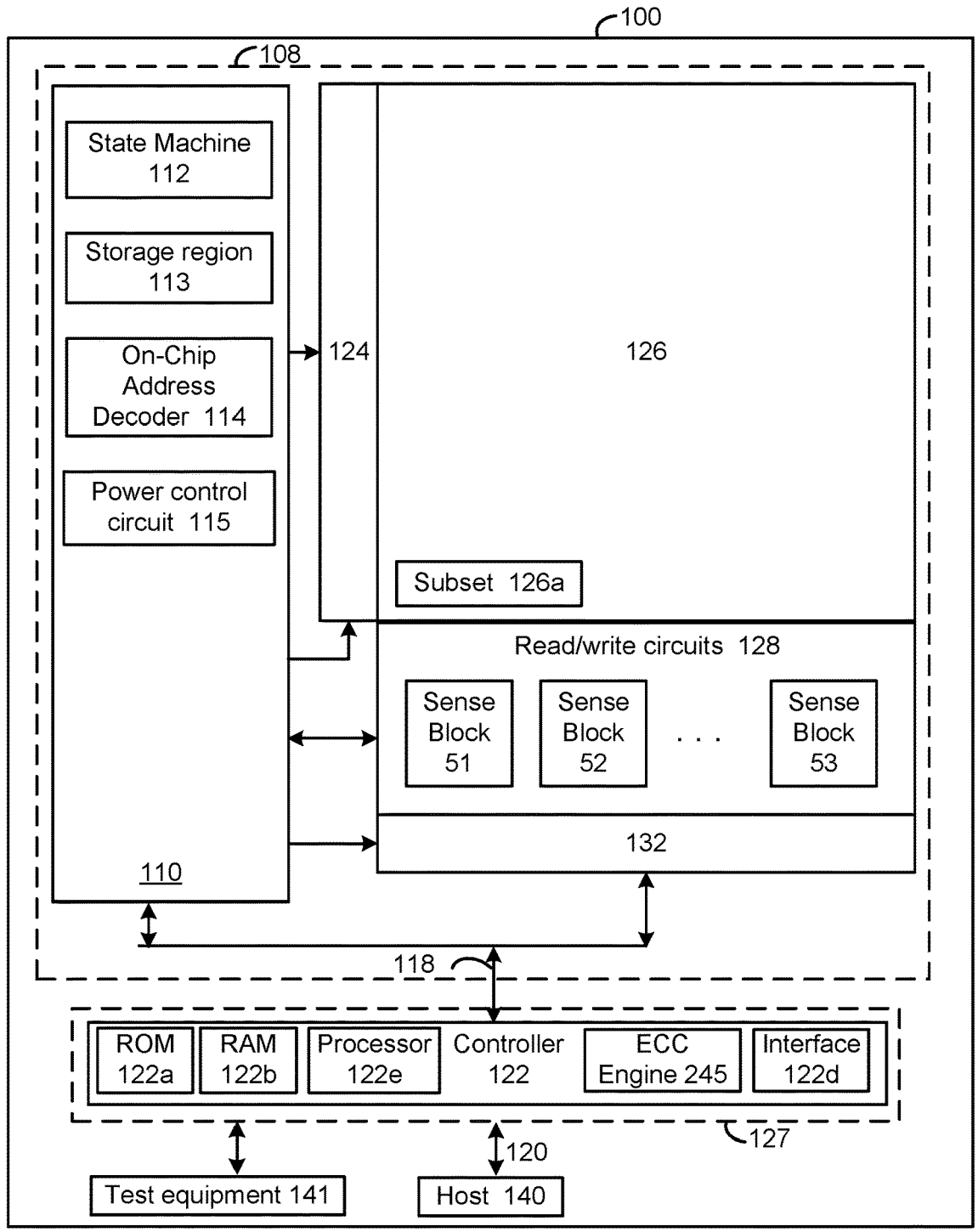
FIG. 1A is a block diagram of an example memory device.

Apparatuses and techniques are described for obtaining a threshold voltage distribution for a set of memory cells based on a user read mode.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer.

In a 2D memory structure, the memory cells may be arranged in horizontal NAND strings on a substrate.

NAND flash memory is widely used for storage in consumer devices, enterprise systems and industrial applications because of its non-volatility, affordability, high storage density and high access speed.

The memory cells can be programmed to have a threshold voltage (Vth) which corresponds to a data state. The Vth is a function of an amount of charge stored in a charge storing material of the memory cell. A program operation can include a sequence of program loops, where each program loop is performed by applying a program pulse to a selected word line. Each program loop can include one or more verify tests.

In some cases, the user data is stored in pages, with one bit per cell per page. For example, a set of memory cells which store three bits per cell can store three pages of user data as lower, middle and upper pages. Each page can be read back separately by applying appropriate read voltages to the selected word line. In a user (customer) read operation, the read voltages applied to the selected word line are data state demarcation voltages since each voltage demarcates or distinguishes between data states. Each voltage is set at a level which is between adjacent Vth distributions of two data states.

At other times, such as in a test or diagnostic mode, the Vth levels of the memory cells are read with more detail to obtain a Vth distribution which indicates the distribution of the cells based on their Vth levels. The Vth distribution has a shape which includes periodic peaks which represents data states, and is obtained by reading the memory cells with many closely spaced read voltages. This provides helpful information to guide an engineer in a troubleshooting process, for example, to diagnose a defective word line. A defective word line can have a high RC time constant, for example, which results in a high fail bit count (number of read errors). In some cases, uncorrectable read errors occur, resulting in the loss of user data. However, previous techniques for determining a Vth distribution of a set of memory cells may not accurately identify an abnormality.

Techniques provided herein address the above and other issues. In one approach, a Vth distribution of a set of memory cells is improved by considering a user read mode for each read voltage which is used to obtain the Vth distribution. The user read mode can be based on various factors including a coding of a page and an increasing or decreasing read order of the read voltages in the read mode. For example, with three bits per cell, one example of a coding is 1-3-3, where one demarcation voltage is used to read the lower page, and three demarcation voltages are used to read both the middle and upper pages. Another example of a coding is 2-3-2, where two demarcation voltages are used to read both the lower and upper pages, and three demarcation voltages are used to read the middle page. Another example of a coding is 1-2-4, where one demarcation voltage is used to read the lower page, two demarcation voltages are used to read the middle page and four demarcation voltages are used to read the upper page.

Generally, various codings can be used with two or more bits per cell.

The read process for the Vth distribution in the test mode is made to mimic the read mode which is used when the memory device is in the hands of the end user. This results in a Vth distribution which reflects the user's experience to facilitate troubleshooting. In some cases, one or more dummy read operations are performed, where the associated read result is discarded, prior to a read operation whose read result which is used to build the Vth distribution.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/ write circuits 128 include multiple sense blocks 51, 52, ... 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

Test equipment 141 can be provided which communicates with the controller 122, for example, to obtain a Vth distribution measurement of a set of the memory cells in a test mode. An engineer can use the test equipment to detect a defective word line, for example, using the techniques disclosed herein.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
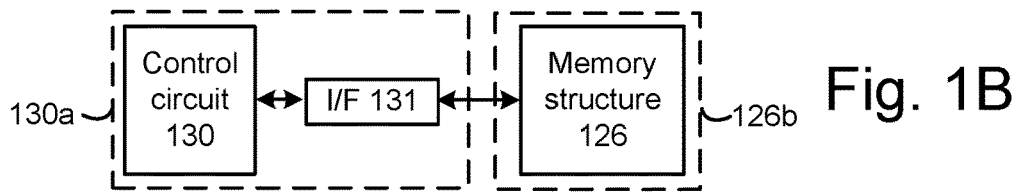
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. The circuit can be configured to issue command via the memory interface to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2:
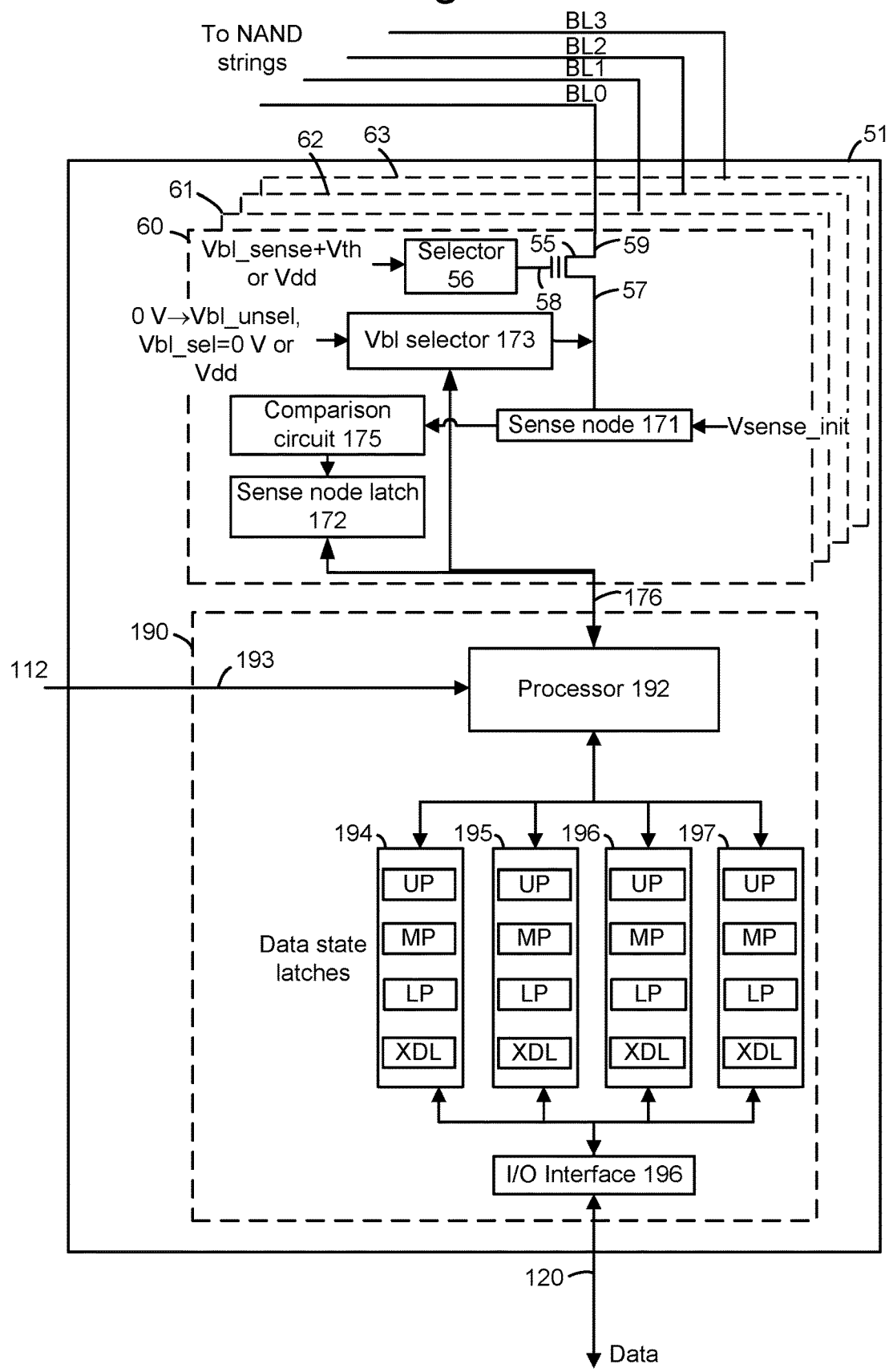
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four data latches, e.g., comprising individual latches LP, MP, UP and XDL can be provided for each sense circuit. In some cases, a different number of data latches may be used. In this example, there are three bits per cell. These bits are stored in the user data latches as part of a lower page (LP), middle page (MP and upper page (UP), respectively. The XDL latch is an input/output (I/O) latch for transferring data to and from the user data latches.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operations. For example, latches may identify that a memory cell's Vth is below a particular verify voltage. The data latches indicate whether a memory cell currently stores one or more bits from a page of data. For example, the LP, MP, UP or TP latches can be flipped (e.g., from 0 to 1) when a lower, middle, upper or top page bit, respectively, is stored in an associated memory cell. All 1's in the latches indicate that an associated memory cell has completed programming.

Figure 3:
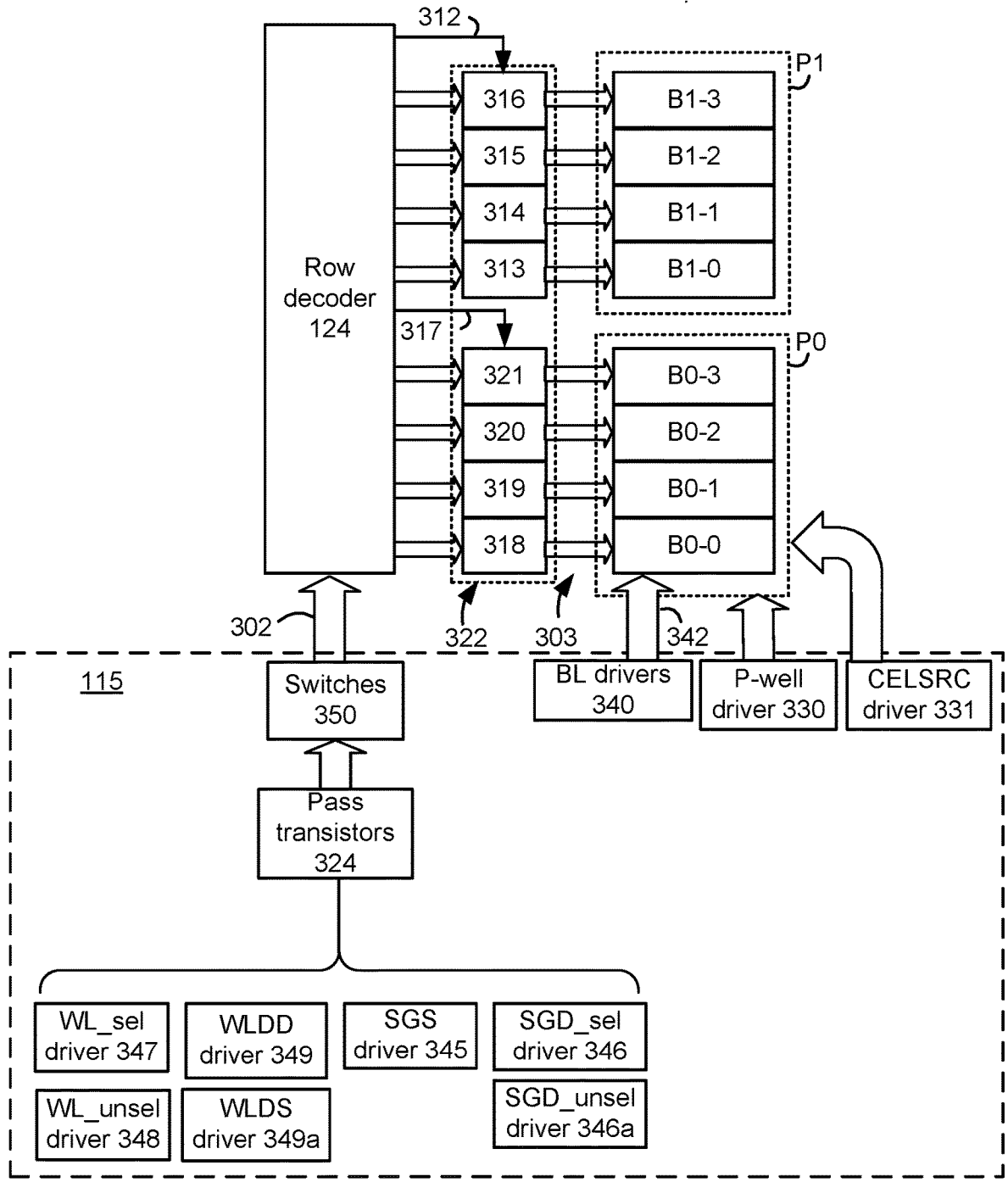
FIG. 3 depicts an example implementation of the power control circuit 115 of FIG. 1A for providing voltages to blocks of memory cells.
Figure 7:
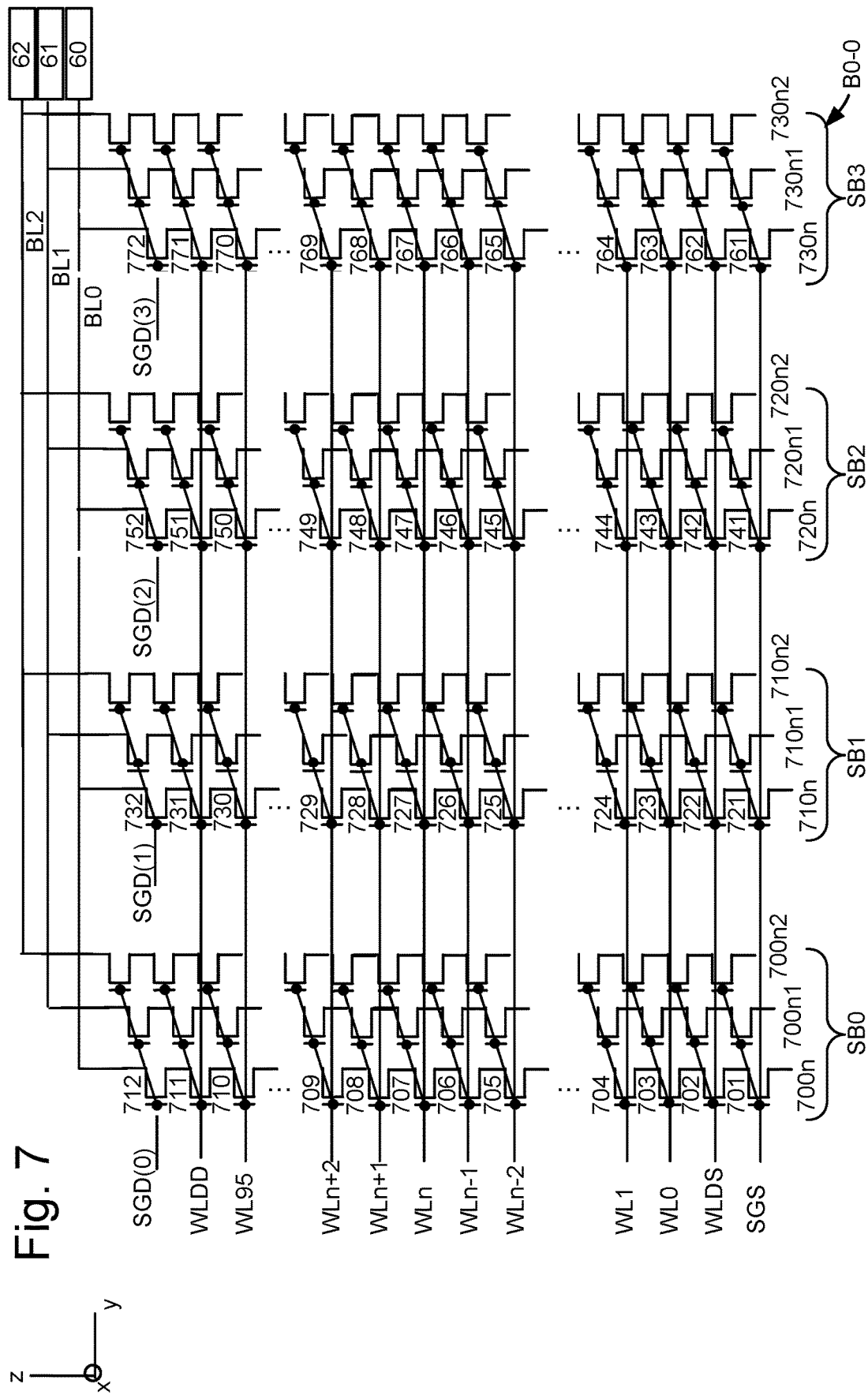
FIG. 7 depicts an example view of the block B0-0 of FIG. 4, with respective NAND strings arranged in sub-blocks, along with associated bit lines and sense circuits.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 7. The row decoder provides a control signal to pass transistors which connect the blocks to the row decoder. In one approach, the pass transistors of each set of blocks are controlled by a common control gate voltage. Thus, the pass transistors for a set of blocks are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 4:
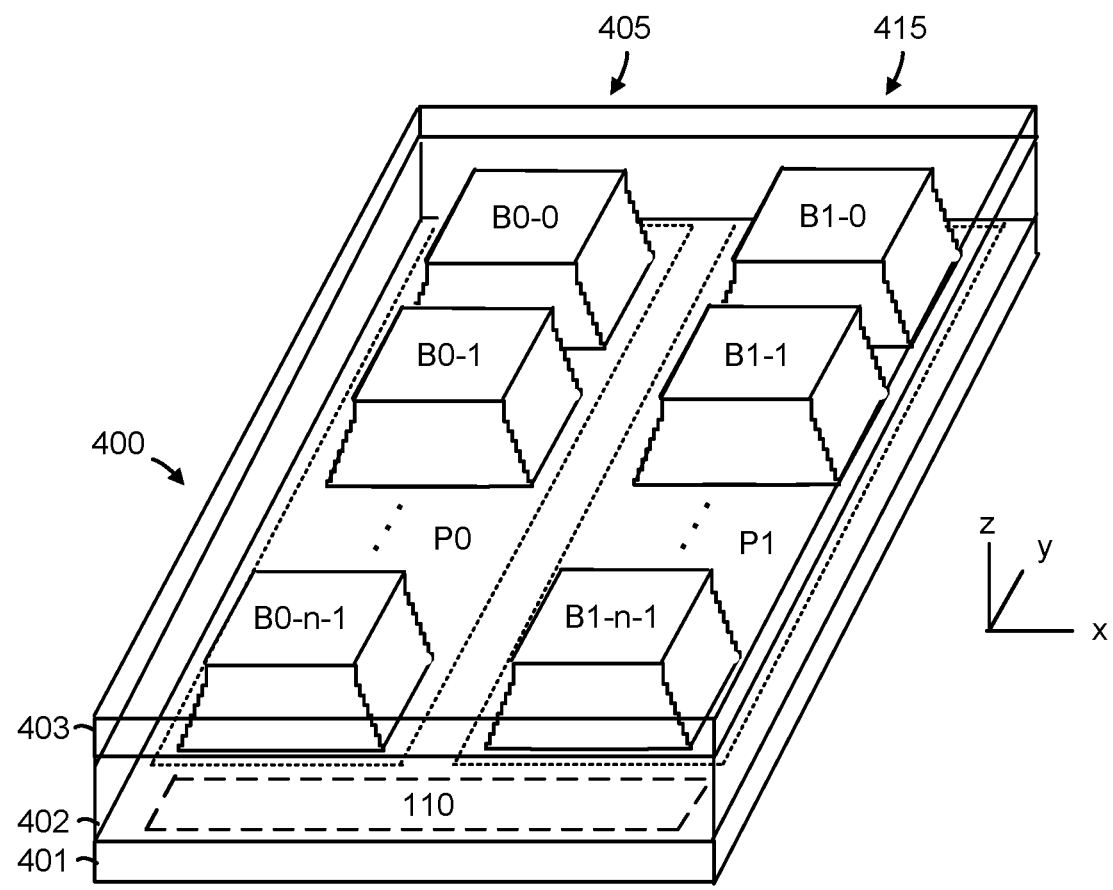
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-n-1, are formed in P0, and a second block sequence 415 of a number n blocks, labelled B1-0 to B1-n-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in different planes can be erased concurrently.

The substrate 401 can also carry circuitry under the blocks, and one or more lower metal layers which are patterned in conductive paths to carry signals of the circuitry.

Figure 5:
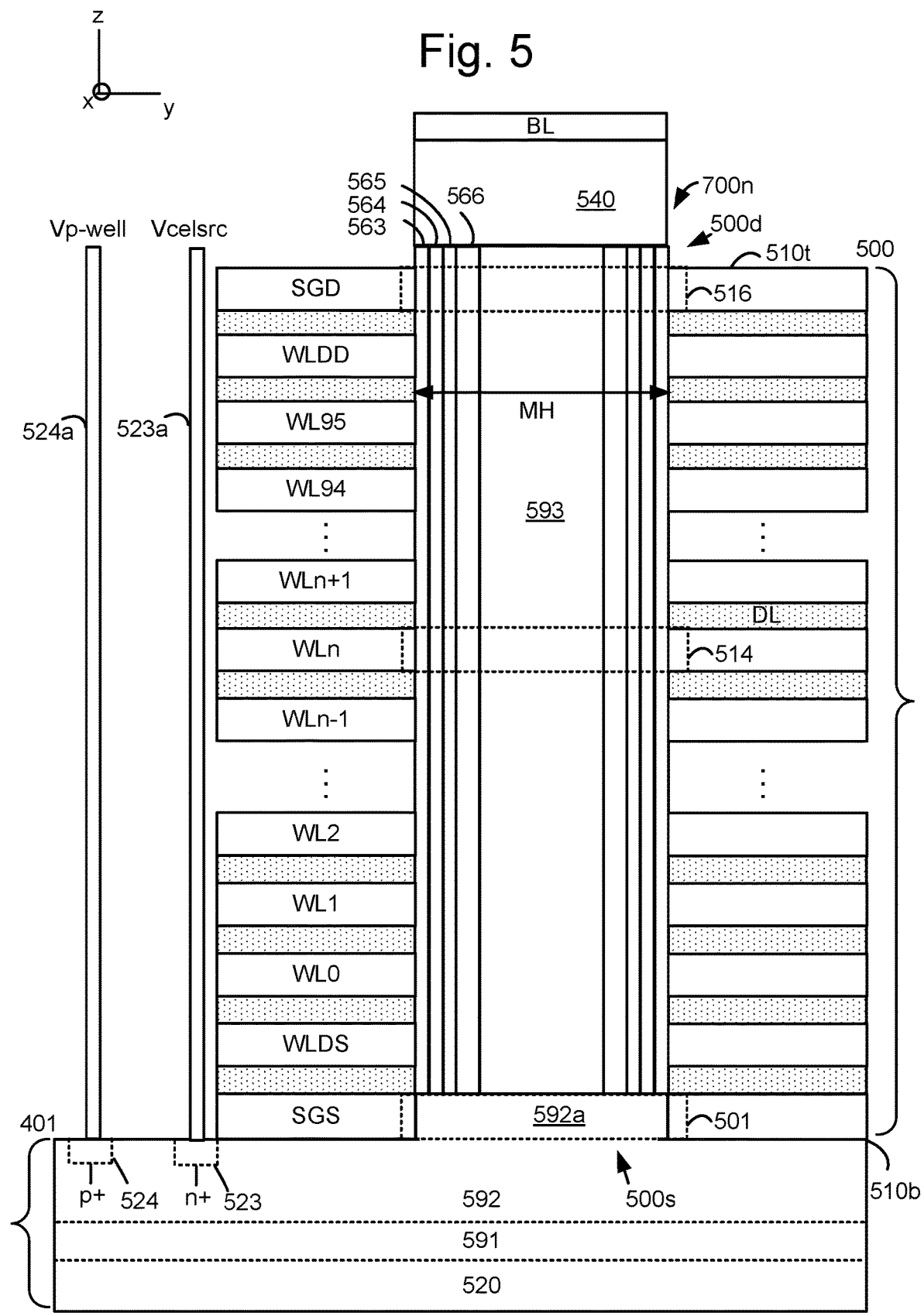
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700n. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn−1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
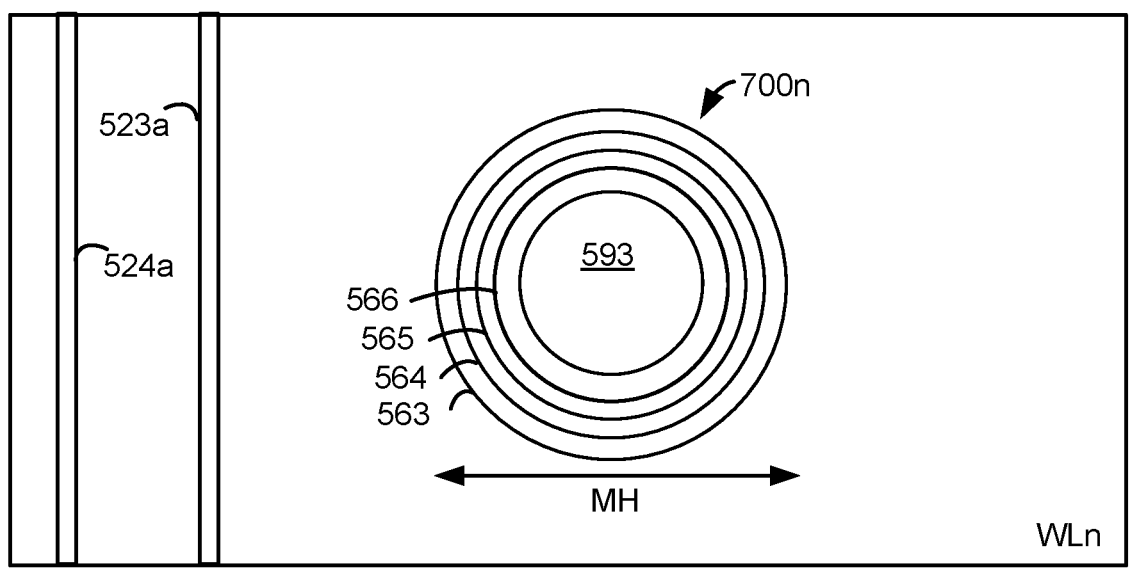
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

FIG. 7 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5 to 7. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can reduce neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via contacts 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

Figure 8:
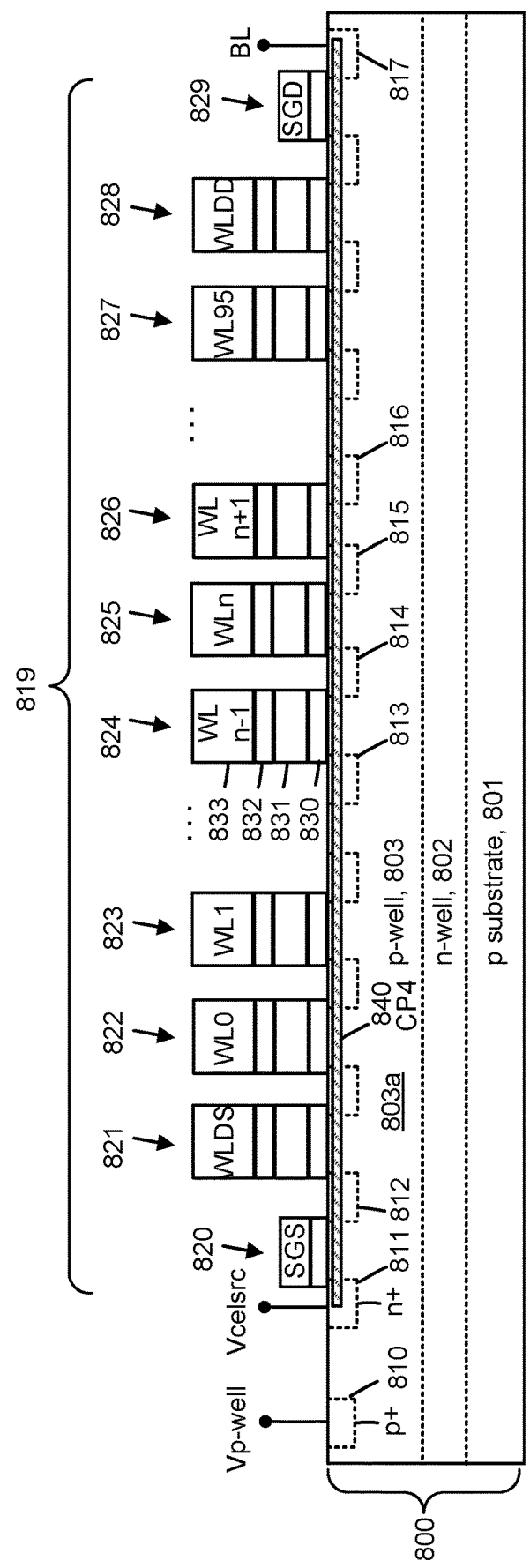
FIG. 8 depicts an example NAND string in a 2D configuration.

FIG. 8 depicts an example NAND string in a 2D configuration. The techniques discussed herein can be used in a 2D memory device as well as the above-described 3D memory device. The channel in a 2D memory device extends horizontally in the substrate rather than in a vertically extending channel layer. In this example, a substrate 800 includes a p-well 803 within an n-well 802, which in turn is in a p substrate 801. Vp-well and Vcelsrc are provided to the p-well via contacts 810 and 811, respectively. The contact 811 is a source line. The erase pulse can be Vp-well. A NAND string 819 is arranged on the substrate and include select gate transistors and memory cells. For example, the NAND string includes a SGS transistor 820, memory cells 821, 822 and 823 connected to WLDS, WL0 and WL1, respectively, memory cells 824, 825 and 826 connected to WLn−1, WLn and WLn+1, respectively, memory cells 827 and 828 connected to WL95 and WLDD, respectively, and a SGD transistor 829. Doped regions in the substrate, such as example doped regions 811-817, act as sources and drains of the transistors. Vbl is provided to the doped region 817. When appropriate voltages are provided to the NAND string, an inversion layer or channel 840 is formed in the p-well. A remaining portion 803a of the p-well is biased at Vp-well.

The example memory cell 824 comprises a tunnel oxide layer 830, a floating gate layer 831, a blocking oxide layer 832 and a control gate 833.

FIG. 9A depicts an example threshold voltage (Vth) distribution of a set of memory cells, with three bits per cell, and data state demarcation voltages for distinguishing between data states, indicating how the Vth can vary based on the read process. With three bits per cell, referred to as a three-level cell or TLC, three pages of data can be stored in the memory cells.

Initially, the memory cells are provided in the Vth distribution 900 of the erased (Er) state. The memory cells are subsequently programmed to a number of programmed states such as A-G using verify voltages VvA-VvG, respectively. Ideally, the A-G data states are represented by the Vth distributions 901-907, respectively. However, when the memory cells are read in a test mode to determine a Vth distribution, the Vth level can appear to be shifted compared to when the memory cells are read in the user read mode. For example, the shift for the A-G states can be to a lower level, as represented by the Vth distributions 901a-907a, respectively, or to a higher level, as represented by the Vth distributions 901b-907b. In some cases, the Vth is shifted lower for some states and higher for other states. This Vth shift makes it difficult to perform troubleshooting in the test mode.

The data state demarcation voltages VrA-VrG are read voltages used to distinguish between adjacent data states. For example, VrA is used to distinguish between the Er and A states, VrB is used to distinguish between the A and B states, and so forth.

FIG. 9B depicts example read voltages in a process for measuring the Vth distribution of FIG. 9A, where each read voltage is in a voltage range and each voltage range encompasses one of the data state demarcation voltages of FIG. 9A. The Vth distributions 900-907 and data state demarcation voltages VrA-VrG of FIG. 9A are repeated. A number of read operations can be performed using a set of closely spaced read voltages 915 to obtain a Vth distribution of a set of memory cells. In this example, the read voltages range from a lowest value Vcgr_1 to a highest, nth value, Vcgr_G in a range 929. Several read operations can be performed for each data state.

The Vth distribution can be obtained by reading each of the memory cells with each of the read voltages. The Vth of a memory cell can be classified into a small range which is between two adjacent read voltages, where the Vth is greater than a lower read voltage of the two adjacent read voltages and a higher read voltage of the two adjacent read voltages.

In this case, the memory cell is in a conductive state when the higher read voltage is applied and a non-conductive state when the lower read voltage is applied.

Moreover, each read voltage can be classified as being in a voltage range which encompasses one of the data state demarcation voltage. For example, the read voltages from Vcgr_1 to Vcgr_A encompass VrA in the A range 920. The read voltages from Vcgr_A+1 to Vcgr_B encompass VrB in the B range 921. The read voltages from Vcgr_B+1 to Vcgr_C encompass VrC in the C range 922. The read voltages from Vcgr_C+1 to Vcgr_D encompass VrD in the D range 923. The read voltages from Vcgr_D+1 to Vcgr_E encompass VrE in the E range 924. The read voltages from Vcgr_E+1 to Vcgr_F encompass VrF in the F range 925. The read voltages from Vcgr_F+1 to Vcgr_G encompass VrG in the G range 926. The respective read voltages 915 can extend in a plurality of adjacent voltage ranges 920-926.

FIG. 9C depicts an example Vth distribution of a set of memory cells, with four bits per cell, and example voltage ranges in a process for measuring the Vth distribution. The Vth distributions are for the sixteen states S0-S15. Read operations can be performed using a set of closely spaced read voltages 927 in a range 950 to obtain the Vth distribution.

The Vth distribution can be obtained by reading each of the memory cells with each of the read voltages in the set. As before, each read voltage can be classified as being in a voltage range. For example, the voltage ranges are the S1-S15 ranges 930-944, respectively. The data state demarcation voltages for S1-S15 are VrS1-VrS15, respectively.

With four bits per cell, referred to as a quad level cell or QLC, four pages of data can be stored in the memory cells. The data of the lower page can be determined by reading the memory cells using data state demarcation voltages of VrS1, VrS3, VrS5, VrS7, VrS9 and VrS13. The data of the lower-middle page can be determined by reading the memory cells using data state demarcation voltages of VrS2, VrS6, VrS10, VrS12 and VrS14. The data of the upper-middle page can be determined by reading the memory cells using data state demarcation voltages of VrS4, VrS11 and VrS15. The data of the upper page can be determined by reading the memory cells using a data state demarcation voltage of VrS8. These are example data state demarcation voltage, as many options are possible.

FIG. 9D depicts an example Vth distribution of a set of memory cells, with five bits per cell, and example voltage ranges in a process for measuring the Vth distribution. The Vth distributions are for the thirty-two states S0-S31. Read operations can be performed using a set of closely spaced read voltages 928 in a range 960 to obtain the Vth distribution.

The Vth distribution can be obtained by reading each of the memory cells with each of the read voltages in the set. As before, each read voltage can be classified as being in a voltage range. For example, the voltage ranges are the S1R-S31R ranges. The data state demarcation voltages for S1-S31 are VrS1-VrS31, respectively.

With five bits per cell, referred to as a penta-level cell or PLC, five pages of data can be stored in the memory cells. The data of the lower page can be determined by reading the memory cells using data state demarcation voltages of VrS1, VrS5, VrS10, VrS12, VrS14, VrS17, VrS23 and VrS30. The data of the lower-middle page can be determined by reading the memory cells using data state demarcation voltages of VrS2, VrS9, VrS15, VrS18, VrS20, VrS24, VrS27 and VrS29. The data of the middle page can be determined by reading the memory cells using data state demarcation voltages of VrS3, VrS6, VrS8, VrS13, VrS21, VrS25 and VrS28. The data of the upper-middle page can be determined by reading the memory cells using data state demarcation voltages of VrS4, VrS7, VrS11, VrS19, VrS22, VrS6 and VrS31. The data of the upper page can be determined by reading the memory cells using a data state demarcation voltage of VrS16. These are example data state demarcation voltage, as many options are possible.

A similar approach can be taken with six or more bits per cell. Six bits per cell is referred to as HLC (hexa-level cell). With HLC cells, there are sixty-four data states. See FIG. 9E.

FIG. 9E depicts an example Vth distribution of a set of memory cells, with six bits per cell, and example voltage ranges in a process for measuring the Vth distribution. The Vth distributions are for the sixty-four states S0-S63. Read operations can be performed using a set of closely spaced read voltages 981 in a range 980 to obtain the Vth distribution.

The Vth distribution can be obtained by reading each of the memory cells with each of the read voltages in the set. As before, each read voltage can be classified as being in a voltage range. For example, the voltage ranges are the S1R-S63R ranges. The data state demarcation voltages for S1-S63 are VrS1-VrS63, respectively.

With six bits per cell, referred to as a hexa-level cell or HLC, six pages of data can be stored in the memory cells.

Figures 10, 11:
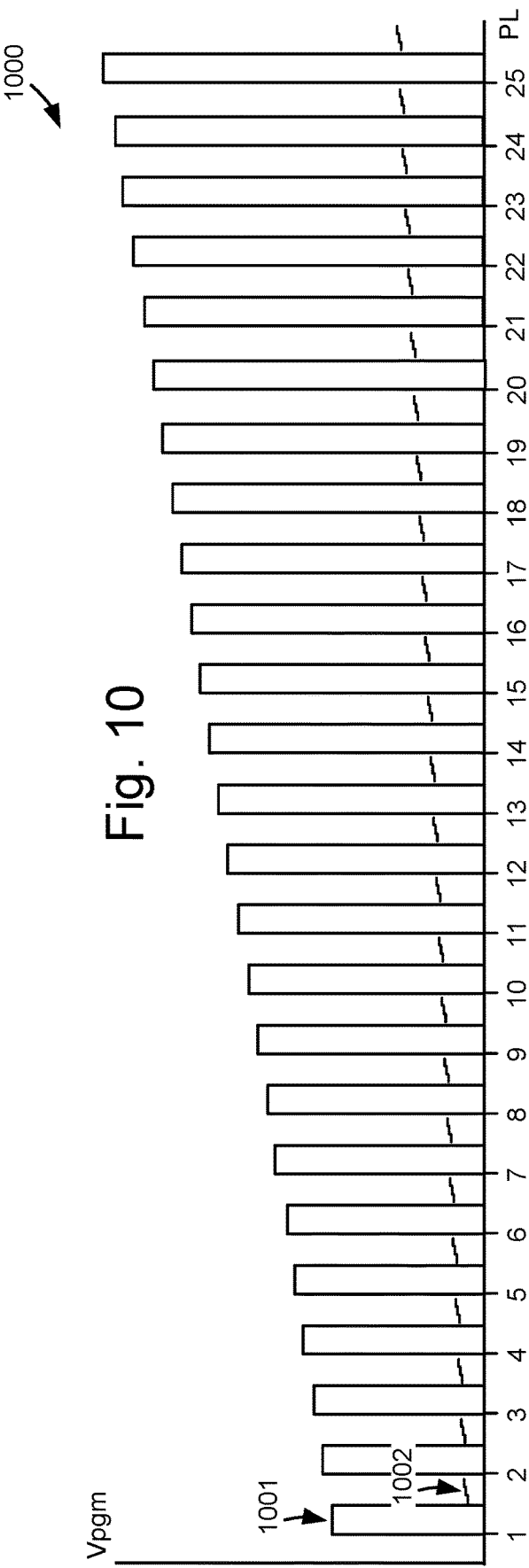
FIG. 10 depicts a plot 1000 of a selected word line voltage versus program loop number in a program operation, consistent with FIG. 9A.
FIG. 11 depicts an example bit encoding for the data states of FIG. 9A.

FIG. 10 depicts a plot 1000 of a selected word line voltage versus program loop number in a program operation, consistent with FIG. 9A. In this example, the voltage signal includes 25 program-verify loops, PL1-PL25. Each loop includes a program pulse and verify voltages. For example, a program pulse plot 1001 and verify voltages (plot 1002) are provided in PL1. The verify voltages are depicted in a simplified form and can be provided for progressively higher data states as the programming proceeds. The peak magnitudes of the program pulses may increase in consecutive program loops as depicted, in a technique referred to as incremental step pulse programming.

FIG. 11 depicts an example bit encoding for the data states of FIG. 9A. The table lists the pages LP, MP and UP and the data states Er-G. A set of bits which is all 1's indicates the Er state. A memory cell which completes programming to one of the programmed states A-G has its bits set to all 1's to indicate that programming is completed.

FIG. 12 depicts example plots for various voltage signals in a program loop consistent with FIG. 10. The program loop includes a pre-charge phase at t0-t1. A program pulse is applied at t2-t3. A recovery phase is at t3-t5. A Vread spike is applied before and after a sensing operation, at t5-t6 and t8-t9, respectively. This is a channel clean voltage which equalizes the channel potential. A sensing operation is performed at t7-t8. For example, in the foggy program pass, this can be a read operation which identifies slow and fast cells. In the fine program pass, this can be a verify test with one or more verify voltages.

A plot 1200 depicts VWL_sel, a voltage of a selected word line in the program operation. A plot 1210 depicts VWL_unsel, a voltage of unselected word lines. A plot 1220 depicts Vsgd_sel, the voltage for SGD transistors of a selected sub-block. A plot 1230 depicts Vsgd_unsel, the voltage for SGD transistors of an unselected sub-block, and Vsgs. A plot 1240 depicts Vbl_unsel, the voltage for bit lines connected to unselected NAND strings. A plot 1250 depicts Vbl_sel, the voltage for bit lines connected to selected NAND strings. A plot 1260 depicts Vsl, the source line voltage.

During the pre-charge, Vsgd_sel is elevated and Vbl_sel=0 V to provide the SGD transistor in a conductive state. Vsgd_sel is then returned to a lower level during the program pulse so that the SGD_sel transistor will be on or off if Vbl is low or high, respectively. With Vbl_unsel high, e.g., 1.5 V, the SGD transistors of the unselected NAND strings will be in a non-conductive state to inhibit programming.

For the selected NAND strings, Vbl_sel can be 0 V.

Vsgd_unsel and Vsgs are elevated during the pre-charge, to provide the SGD and SGS transistors in a conductive state, and then returned to 0 V during the program pulse.

During the sensing, VWL_seL=Vcgr, a read or verify voltage. Vsgd_sel and Vsgs are set to Vread to provide the corresponding transistors in a conductive state to allow sensing to occur. Vsgd_unsel is spiked up to Vread at t5-t6 and then kept at 0 V while Vbl_unsel is set at a small positive voltage to provide the corresponding SGD transistors in a non-conductive state, to avoid interfering with the sensing of the selected NAND strings. The spiking of Vsgd_unsel to Vread helps drain out residue electrons from the channels of the unselected NAND strings in the unselected sub-blocks.

Vbl_sel is elevated to Vsense to allow sensing to occur.

Vsl can be elevated during the pre-charge, the program pulse and the verify test.

Figure 13A:
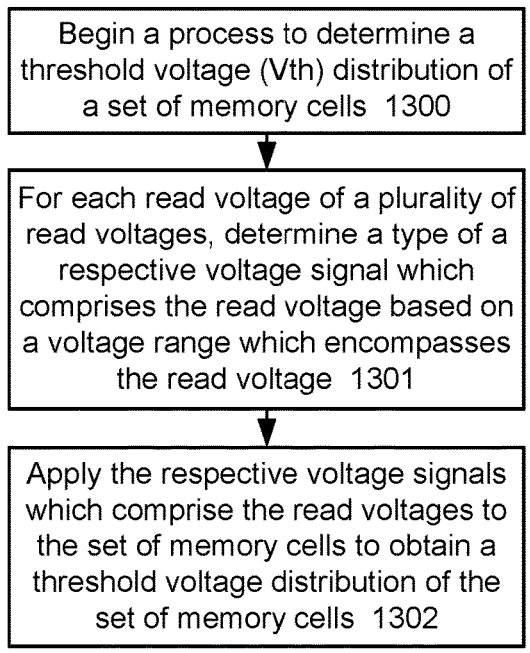
FIG. 13A depicts a flowchart of an example process for determine a Vth distribution of a set of memory cells, consistent with FIG. 9B.

FIG. 13A depicts a flowchart of an example process for determine a Vth distribution of a set of memory cells, consistent with FIG. 9B. Step 1300 begins a process to determine a threshold voltage (Vth) distribution of a set of memory cells, such as memory cells connected to a selected word line. Step 1301 includes, for each read voltage of a plurality of read voltages (e.g., in the set of read voltages 915 of FIG. 9B), determining a type of a respective voltage signal which comprises the read voltage based on a voltage range which encompasses the read voltage. For example, as discussed in connection with FIG. 9B, each read voltage may be classified as being in one of the ranges 920-926.

Step 1302 includes applying the respective voltage signals which comprise the read voltages to the set of memory cells to obtain a threshold voltage distribution of the set of memory cells. Each respective voltage signal comprises one read voltage for which the sensing result is used to determine the Vth distribution. The respective voltage signals may also include dummy read voltages before the one read voltage. In one approach, read results are obtained when each of the dummy read voltages is applied to the set of memory cells, but these read results are discarded and thus not used to determine the Vth distribution. In another approach, no read results are obtained when the dummy read voltages are applied to the set of memory cells. That is, no sensing occurs.

Figure 13B:
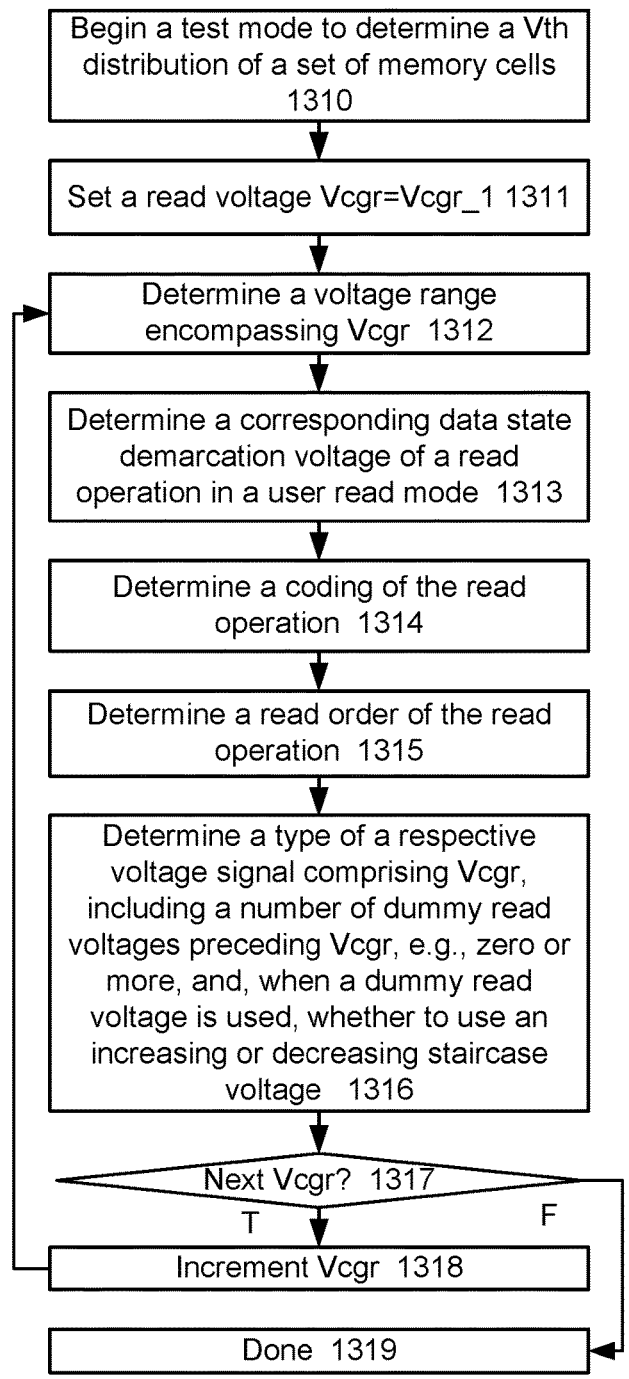
FIG. 13B depicts a flowchart of an example implementation of the process of FIG. 13A.

FIG. 13B depicts a flowchart of an example implementation of the process of FIG. 13A. Step 1310 begins a test mode to determine a Vth distribution of a set of memory cells. Step 1311 sets a control gate read voltage, e.g., word line voltage, to an initial level Vcgr=Vcgr_1. Step 1312 determines a voltage range encompassing Vcgr. FIG. 9B shows examples ranges 920-926. Step 1313 determines a corresponding data state demarcation voltage of a read operation in a user read mode, e.g., VrA-VrG in FIG. 9B. Step 1314 determines a coding of the read operation in a user read mode, e.g., 1-3-3, 2-3-2 or 1-2-4. Step 1315 determines a read order of the read operation in a user read mode, e.g., increasing or decreasing. This order applies when there is more than one read voltage in the read operation in the user read mode. Step 1316 determines a type of a respective voltage signal comprising Vcgr, including a number of dummy read voltages preceding Vcgr, e.g., zero or more, and, when a dummy read voltage is used, whether to use an increasing or decreasing staircase voltage.

A decision step 1317 determines whether there is a next Vcgr in the process. If the decision step is true, step 1318 increments Vcgr and step 1312 is repeated. If the decision step is false, the process is done at step 1319.

In this process, each voltage range encompasses a corresponding data state demarcation voltage of a user read mode, and when the corresponding data state demarcation voltage is preceded by a number of preceding data state demarcation voltage in the user read mode, the respective voltage signal comprises a number of dummy read voltages corresponding to the number of preceding data state demarcation voltages.

Additionally, the dummy read voltages correspond to the preceding data state demarcation voltages in duration and magnitude, e.g., within a tolerance of +/−25%. That is, the duration of a dummy read voltage is equal to the duration of corresponding preceding data state demarcation voltage within a tolerance, and the magnitude of a dummy read voltage is equal to the duration of a corresponding preceding data state demarcation voltage within a tolerance. For example, in FIG. 19, the voltage signal at VrA is an example of a preceding data state demarcation voltage which precedes a data state demarcation voltage at VrC. As another example, in FIG. 22, the voltage signals at VrA and VrC are examples of preceding data state demarcation voltages which precede a data state demarcation voltage at VrF.

Figure 13C:
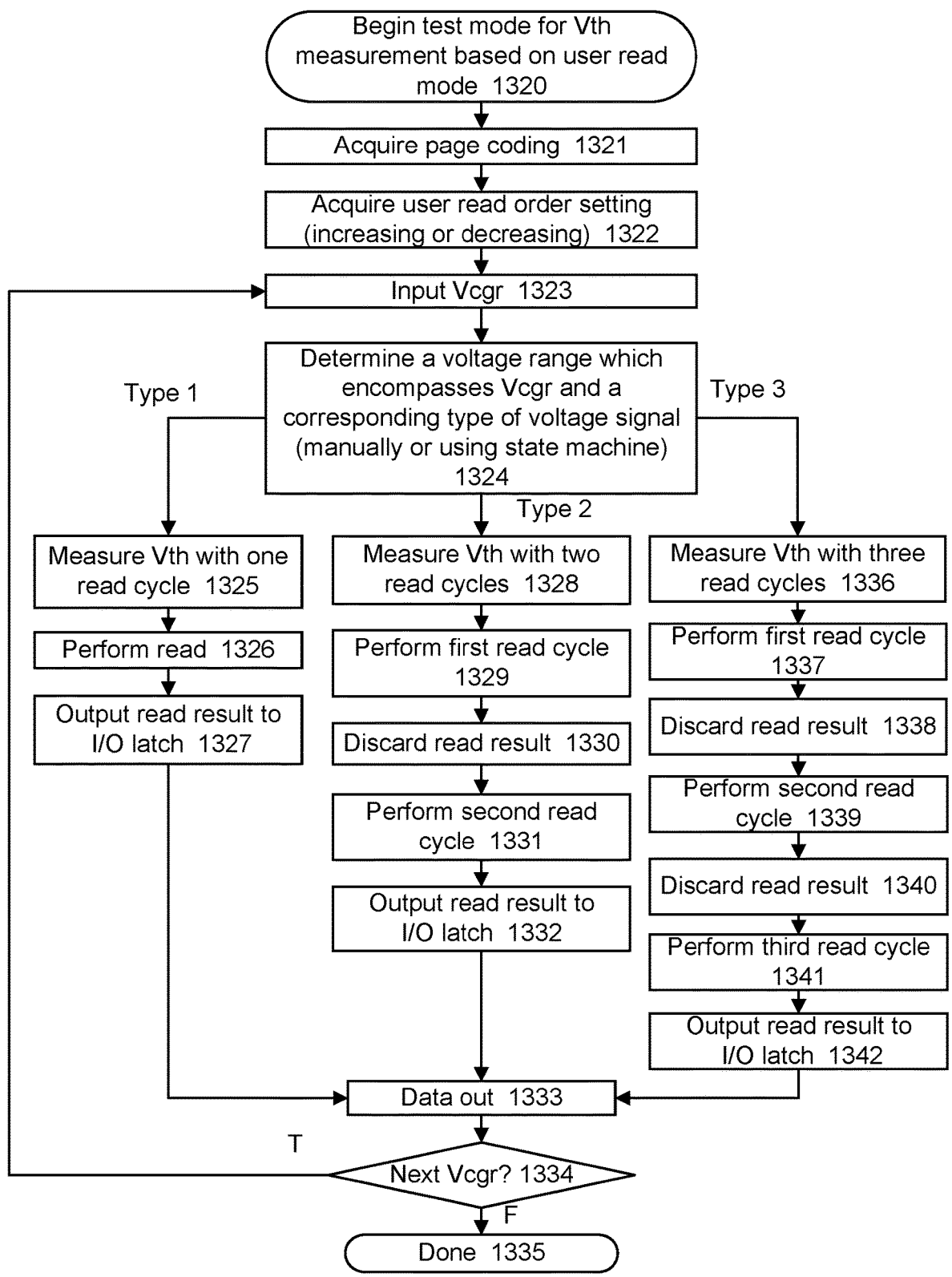
FIG. 13C depicts a flowchart of an example implementation of the process of FIG. 13B.

FIG. 13C depicts a flowchart of an example implementation of the process of FIG. 13B. Step 1320 begins a test mode for Vth measurement based on a user read mode. As mentioned, the accuracy of a Vth distribution of a set of memory cells is improved by considering a user read mode for each read voltage which is used to obtain the Vth distribution in the test mode, which is separate from the user read mode. Step 1321 includes acquiring a page coding. For example, with three bits per cell, the coding could be 1-3-3, 2-3-2 or 1-2-4.

With 1-3-3 coding, the lower page is read using a single data state demarcation voltage, VrD, the middle page is read using three data state demarcation voltages, VrA, VrC and VrF, and the upper page is read using three data state demarcation voltages, VrB, VrE and VrG. With 2-3-2 coding, the lower page is read using two data state demarcation voltages, VrA and VrE, the middle page is read using three data state demarcation voltages, VrB, VrD and VrF, and the upper page is read using two data state demarcation voltages, VrC and VrG. With 1-2-4 coding, the lower page is read using a single data state demarcation voltage, VrD, the middle page is read using two data state demarcation voltages, VrB and VrF, and the upper page is read using four data state demarcation voltages, VrA, VrC, VrE and VrG.

With two bits per cell, 1-2 or 2-1 coding can be used, where one page is read using VrB and the other page is read using VrA and VrC. The memory cells are in the Er, A, B and C states. In other examples, four or five bits are stored in each cell so that there are four or five pages with corresponding read voltages.

Step 1322 includes acquiring a user read order setting, which can be increasing (normal order) or decreasing (reverse order). With the increasing setting, a page read uses multiple read voltages starting from a lowest read voltage and ending at a highest read voltage, in an increasing staircase voltage signal. With the decreasing setting, a page read uses multiple read voltages starting from a highest read voltage and ending at a lowest read voltage, in a decreasing staircase voltage signal.

Step 1323 includes inputting a read voltage, Vcgr. For example, the initial value may be Vcgr_1 as in FIG. 9B. Step 1324 includes determining a voltage range which encompasses Vcgr and a corresponding type of voltage signal. This can be done manually, such as by using the test equipment 141, or automatically, such as by using the state machine 112 (FIG. 1A). In this example, the type of the voltage signal can be Type 1, 2 or 3. The type is selected from among a plurality of available types of voltage signals. Generally, the number of types is equal to the number of bits per cell. A type 1, 2 or 3 voltage signal has one, two or three read voltages in respective sensing cycles. When there is more than one read voltage, the read voltages before the last read voltage are referred to as dummy read voltages. In this example, when a dummy read voltage is applied, a read result is obtained and then discarded so that the result is not used to build the Vth distribution. In another approach, when a dummy read voltage is applied, no sensing is performed so that no read result is obtained. This approach can save power but may be more complex to implement. Each read voltage can have roughly the same duration, within tolerance of +/−25% for example.

For a type 1 voltage signal, step 1325 involves measuring the Vth with one read cycle referred to as R CLK. This includes performing a read operation at step 1326 and outputting the read result to an I/O latch (step 1327) such as XDL in FIG. 2. Step 1333 involves outputting the read data from the I/O latch to a controller. A decision step 1334 determines whether there is a next Vcgr in the process. If the decision step 1334 is true, step 1323 inputs the next Vcgr value. If the decision step 1334 is false, the process is done at step 1335.

For a type 2 voltage signal, step 1328 involves measuring the Vth with two read cycles, e.g., first and second read cycles referred to as R CLK and RWL CLK respectively. This includes performing a first read cycle at step 1329 and discarding the read result at step 1330. Step 1331 performs a second read cycle and step 1332 outputs the read result to an I/O latch, after which step 1333 is reached.

For a type 3 voltage signal, step 1336 involves measuring the Vth with three read cycles, e.g., a first read cycle referred to as R CLK and second and third read cycles each referred to as RWL CLK. This includes performing a first read cycle at step 1337 and discarding the read result at step 1338. A second read cycle is performed at step 1339 and the read result is discarded at step 1340. Step 1341 performs a third read cycle and step 1342 outputs the read result to an I/O latch, after which step 1333 is reached.

A method which is consistent with the above process includes: reading a set of memory cells with read voltages in a first voltage range (e.g., the C range 922 of FIG. 9B), where each read voltage (Vcgr_B+1 to Vcgr_C) of the first voltage range is in a respective voltage signal (1900); and reading the set of memory cells with read voltages (Vcgr_E+1 to Vcgr_F) in a second voltage range (e.g., the F range 925), different than the first voltage range. Each read voltage of the second voltage range is in a respective voltage signal (2200). A number of dummy read voltages (e.g., VrA) before the read voltages in the respective voltage signals (1900) of the first voltage range is different than a number of dummy read voltages (e.g., VrA and VrC) before the read voltages in the respective voltage signals of the second voltage range.

The method can further include obtaining a threshold voltage distribution of the set of memory cells based on the reading of the set of memory cells with the read voltages in the first voltage range and the reading of the set of memory cells with the read voltages in the second voltage range.

The method can further include, separate from the obtaining of the threshold voltage distribution, in a user read mode, reading a page of a data from the set of memory cells using a corresponding data state demarcation voltage in the first voltage range and a number of preceding data state demarcation voltages. The number of dummy read voltages in each respective voltage signal comprising the read voltages in the first voltage range is equal to the number of preceding data state demarcation voltages. For example, as described further below, the 1-3-3 user read mode with an increasing voltage can involve the voltage signals 2000, 2200 and 2300 for the lower, middle and upper pages. The 1-3-3 user read mode with a decreasing voltage can involve the voltage signals 2000, 2400 and 2500 for the lower, middle and upper pages. The 2-3-2 user read mode with an increasing voltage can involve the voltage signals 2100, 3300 and 3400 for the lower, middle and upper pages. The 2-3-2 user read mode with a decreasing voltage can involve the voltage signals 3500, 3600 and 3700 for the lower, middle and upper pages.

In one approach, sensing operations are not performed for the set of memory cells when the dummy read voltages are applied to the set of memory cells.

In another approach, the method further includes performing sensing operations for the set of memory cells during the dummy read voltages and discarding results from the sensing operations.

For single level cells (SLC), the test read mode and the user read mode are aligned since only one clock cycle (R CLK) is needed in both cases. However, for multi-level cells (MLC), an additional clock cycle (RWL) is introduced. For example, with 1-3-3 coding and a decreasing voltage signal, the lower page read is only using R CLK, while the middle and upper pages are read using R CLK and RWL clock. This is the root cause of the discrepancy between the fail bit count and the Vth distribution.

The techniques provided herein provide a realistic Vth measurement based on the user read mode to address the discrepancy between fail bit count and the Vth distribution. The techniques use a read operation during RWL CLK in addition to the read operation during R CLK when measuring the Vth distribution. The read clock combinations and corresponding timing is therefore exactly aligned with the user read mode. The techniques can be used with multiple bits per cell, including 3, 4, 5 or more bits. Using 3 bits per cell (TLC) as an example, there are three types of read clock combinations for obtaining the Vth distribution which mimic the user TLC read mode. Type 1 uses R CLK only, type 2 uses R CLK+RWL CLK, and type 3 uses R CLK+RWL CLK+RWL CLK. With type 1, the single sense result will be used to build the Vth distribution. With type 2 and 3, only the last sense result, which is done in the last RWL CLK, will be used to build the Vth distribution. The previous sense results from R CLK or R CLK and RWL CLK will be aborted as dummy sense results.

Two example approaches can be used to determine the type of voltage signal and the corresponding read CLK combinations. A first approach automatically selects the type based on Vcgr. For example, the NAND chip state machine can select the type based on the value of Vcgr, the user page coding and the user read order (increasing or decreasing). For example, if Vcgr is in F range 925 as depicted in FIG. 9B, and 1-3-3 coding with the increasing voltage order is used, the voltage signal will be of type 3 with R CLK+RWL CLK+RWL CLK. Based on the user read mode, a corresponding look up table for the voltage signal type can be defined, such as depicted in FIGS. 14A and 14B.

A second approach involves a manual Vcgr selection. In this approach, the assignment of a type based on a value of Vcgr is done manually by an engineer, for example. This approach provides flexibility. The types of voltage signals and read CLK combinations can be invoked by different commands.

The parameters listed below can be invoked to assist in the techniques described herein:

F_read_coding: Page coding selection (e.g., 1-3-3, 2-3-2, 1-2-4).

F_read_order: Read order selection (e.g., increasing or decreasing).

F_A_top: A range top bound definition (Vcgr_A in FIG. B).

F_B_top: B range top bound definition (Vcgr_B).

F_C_top: C range top bound definition (Vcgr_C).

F_D_top: D range top bound definition (Vcgr_D).

F_E_top: E range top bound definition (Vcgr_E).

F_F_top: F range top bound definition (Vcgr_F).

In the automatic approach mentioned above, a new command code (CMDXX) can be used with the following command sequences and steps.

Step 1: Internal Vcgr input
55h-Add(03h)-D(TEMPPARA0)-55h-Add(04h)-D(TEMP-PARA1)-55h-Add(01h)-D(01h).

Step 2: Test read operation
D8-00h-Address (5 cycles)-XXh=>Busy (tR)–>Ready

Step 3: Test read data out
05h-Address (5 cycles)–E0h=>Data-out

Step 4: Vary Vcgrv by looping through steps 1-3.

55h is an address which receives a command. Add(01h), Add(03h) and Add(04h) are addresses of value 01, 03 and 04 in hexadecimal (h). D8 is an output data byte. 00h and E0h are bytes of command data.

In the manual approach mentioned above, different command codes (e.g., CMDAA, CMDBB, CMDCC, and so forth) can be used to invoke different types read CLK combinations for Vth measurement with the following command sequences and steps.

Step 1: Internal Vcgr input
55h-Add(03h)-D(TEMPPARA0)-55h-Add(04h)-D(TEMP-PARA1)-55h-Add(01h)-D(01h).

Step 2: Test read operation
D8-00h-Address (5 cycles)-AAh/BBh/CCh=>Busy (tR)–>Ready Step 3: Test read data out
05h-Address (5 cycles)-E0h=>Data-out Step 4: Vary Vcgrv by looping through steps 1-3.

The techniques described herein solve the mismatch between the Vth obtained in a test mode and the Vth obtained in a user read mode. This discrepancy is becoming more serious with higher logical bit densities. With this approach, engineering time and effort can be reduced.

FIG. 14A depicts an example table which cross-references a range of read voltages, Vcgr, consistent with FIGS. 9B and 13C, to a type of voltage signal, for three bits per cell and a 1-3-3 page coding. The ranges of Vth can be the A-G ranges such as depicted in FIG. 9B. The increasing type of voltage signal is discussed first. For the A range, type 1 is used as depicted by Example 1. For the B range, type 1 is used as depicted by Example 2. For the C range, type 2 is used as depicted by Example 3. For the D range, type 1 is used as depicted by Example 4. For the E range, type 2 is used as depicted by Example 5. For the F range, type 3 is used as depicted by Example 6. For the G range, type 3 is used as depicted by Example 7.

The decreasing type of voltage signal is discussed next. For the A range, type 3 is used as depicted by Example 8. For the B range, type 3 is used as depicted by Example 9. For the C range, type 2 is used as depicted by Example 10. For the D range, type 1 is used as depicted by Example 4. For the E range, type 2 is used as depicted by Example 11. For the F range, type 1 is used as depicted by Example 12. For the G range, type 1 is used as depicted by Example 13.

Generally, each voltage range encompasses a corresponding data state demarcation voltage of a user read mode. For example, the A-G ranges encompass the data state demarcation voltages VrA-VrG. For each respective voltage signal of the test mode, the type is based on a number of data state demarcation voltages which precede the corresponding data state demarcation voltage in the user read mode. For example, with type 1, 2 or 3, there are 0, 1 or 2 preceding data state demarcation voltages, respectively. For instance, when the corresponding data state demarcation voltage is VrA in the MP of the 1-3-3 increasing read order coding, there is no preceding data state demarcation voltage. In another example, when the corresponding data state demarcation voltage is VrC in the MP of the 1-3-3 increasing read order coding, there is one preceding data state demarcation voltage, VrA. In another example, when the corresponding data state demarcation voltage is VrF in the MP of the 1-3-3 increasing read order coding, there are two preceding data state demarcation voltages, VrA and VrC.

For type 1, in one approach, the corresponding data state demarcation voltage is a single data state demarcation voltage in the user read mode, and the type of the respective voltage signal comprises zero dummy read voltages. An example of a single data state demarcation voltage is VrD in the LP of the 1-3-3 and 1-2-4 coding.

For type 1, in another approach, the corresponding data state demarcation voltage is a first data state demarcation voltage among multiple data state demarcation voltages in the user read mode, and the type of the respective voltage signal comprises zero dummy read voltages. Examples of such first data state demarcation voltages include VrA in the MP of the 1-3-3 increasing read order coding, which is followed by VrC and VrF in the user read mode, but, in the test mode, VrC and VrF are not applied. Another example is VrB in the UP of the 1-3-3 increasing read order coding, which is followed by VrE and VrG in the user read mode, but, in the test mode, VrE and VrG are not applied.

For type 2, in one approach, the corresponding data state demarcation voltage is a second data state demarcation voltage which follows a first data state demarcation voltage in the user read mode, and the type of the respective voltage signal comprises a single dummy read voltage corresponding to the first data state demarcation voltage. For example, VrC is the second data state demarcation voltage in the MP of the 1-3-3 increasing read order coding, and VrA is the first data state demarcation voltage. In another example, VrE is the second data state demarcation voltage in the UP of the 1-3-3 increasing read order coding, and VrB is the first data state demarcation voltage.

For type 3, in one approach, the corresponding data state demarcation voltage is a third data state demarcation which follows first and second data state demarcation voltages in the user read mode, and the type of the respective voltage signal comprises first and second dummy read voltages corresponding to the first and second data state demarcation voltages, respectively. For example, VrF is the third data state demarcation voltage in the MP of the 1-3-3 increasing read order coding, and VrA and VrC are the first and second data state demarcation voltages, respectively. In another example, VrG is the third data state demarcation voltage in the UP of the 1-3-3 increasing read order coding, and VrB and VrE are the first and second data state demarcation voltages, respectively.

FIG. 14B depicts an example table which cross-references a range of read voltages, Vcgr, consistent with FIGS. 9B and 13C, to a type of voltage signal, for three bits per cell and a 2-3-2 page coding. The ranges of Vth can be the A-G ranges such as depicted in FIG. 9B. The increasing type of voltage signal is discussed first. For the A range, type 1 is used as depicted by Example 1. For the B range, type 1 is used as depicted by Example 2. For the C range, type 1 is used as depicted by Example 14. For the D range, type 2 is used as depicted by Example 15. For the E range, type 2 is used as depicted by Example 16. For the F range, type 3 is used as depicted by Example 17. For the G range, type 2 is used as depicted by Example 18.

The decreasing type of voltage signal is discussed next. For the A range, type 2 is used as depicted by Example 19. For the B range, type 3 is used as depicted by Example 20. For the C range, type 2 is used as depicted by Example 21. For the D range, type 2 is used as depicted by Example 22. For the E range, type 1 is used as depicted by Example 23. For the F range, type 1 is used as depicted by Example 12. For the G range, type 1 is used as depicted by Example 13.

FIG. 14C depicts an example table which cross-references a page read operation to one of the examples of FIG. 14A, for a lower page (LP), a middle page (MP) and an upper page (UP) of a 1-3-3 page coding. The increasing type of voltage signal is discussed first. For the LP, MP or UP, see Examples 4, 6 and 7, respectively. The decreasing type of voltage signal is discussed next. For the LP, MP or UP, see Examples 4, 8 and 9, respectively.

FIG. 14D depicts an example table which cross-references a page read operation to one of the examples of FIG. 14B, for a lower page (LP), a middle page (MP) and an upper page (UP) of a 2-3-2 page coding. The increasing type of voltage signal is discussed first. For the LP, MP or UP, see Examples 5, 17 and 18, respectively. The decreasing type of voltage signal is discussed next. For the LP, MP or UP, see Examples 19, 20 and 21, respectively.

FIG. 15A depicts an example of a first type of voltage signal, consistent with FIGS. 14A and 14B. This type of signal comprises a read voltage at block 1500, where a sensing result is used for a Vth distribution.

FIG. 15B depicts an example of a second type of voltage signal, consistent with FIGS. 14A and 14B. This type of signal comprises a dummy read voltage at block 1510, where a sensing result is discarded, and a read voltage at block 1511, where a sensing result is used for a Vth distribution.

FIG. 15C depicts an example of a third type of voltage signal, consistent with FIGS. 14A and 14B. This type of signal comprises a first dummy read voltage at block 1520, where a sensing result is discarded, a second dummy read voltage at block 1521, where a sensing result is discarded, and a read voltage at block 1522, where a sensing result is used for a Vth distribution.

In FIG. 16-39, the vertical dimension denotes voltage and the horizontal dimension denotes time. Vwl_sel and Vwl_unsel are selected and unselected word line voltages, respectively.

Figure 16:
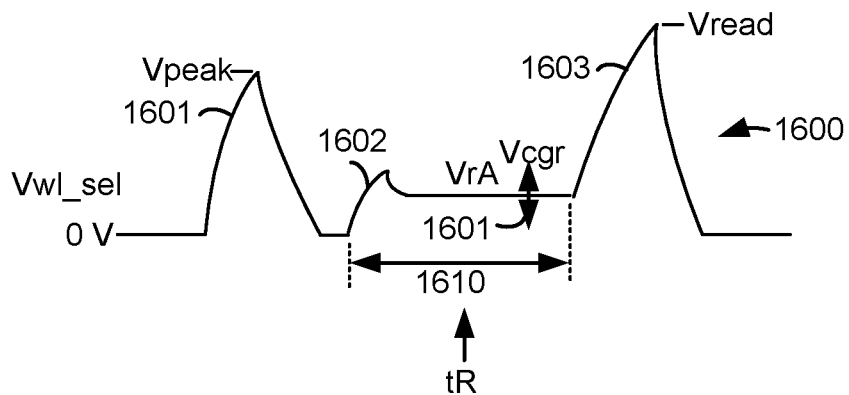
FIG. 16 depicts a voltage signal for a selected word line, consistent with Example 1 in FIGS. 14A and 14B.

FIG. 16 depicts a voltage signal for a selected word line, consistent with Example 1 in FIGS. 14A and 14B. In the voltage signal 1600, a pre-read voltage spike 1601 from 0 V to Vpeak can be used to avoid read disturb on unselected strings. Vpeak may be less than Vread, for example which is, e.g., 8-9 V. After the spike is applied, the voltage transitions to a read voltage Vcgr in a range encompassing VrA. The range of Vcgr is denoted by a vertical arrow 1601. A Vcgr range is also denoted by a similar vertical arrow in FIG. 18-39. This transition involves a decrease to 0 V followed by an increase with a word line over kick 1602. Over kicks and under kicks can be used to decrease the time used to transition a voltage. The memory cells are sensed relative to Vcgr at a read time, tR. Subsequently a post-read Vread spike 1603 can be used to equalize the channel potential. The read voltage is applied in a time period 1610. This represents the duration of the read voltage, in one approach.

During the sensing, Vbl can be set to a sensing level, Vsense. A voltage signal may be provided for the SGD transistors of a selected sub-block to provide them in a conductive state during sensing. A voltage signal may be provided for the SGD transistors of an unselected sub-block to provide them in a non-conductive state during sensing. A voltage signal may be provided for the SGS transistors to provide them in a conductive state during sensing.

Figure 17:
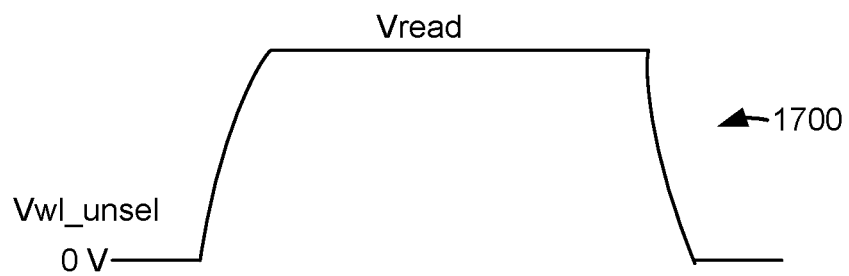
FIG. 17 depicts a voltage signal for unselected word lines, consistent with FIG. 16.

FIG. 17 depicts a voltage signal for unselected word lines, consistent with FIG. 16. In the voltage signal 1700, Vwl_unsel can be increased from 0 V to Vread, maintained at Vread during the sensing (reading) and returned to 0 V after the sensing.

Figure 18:
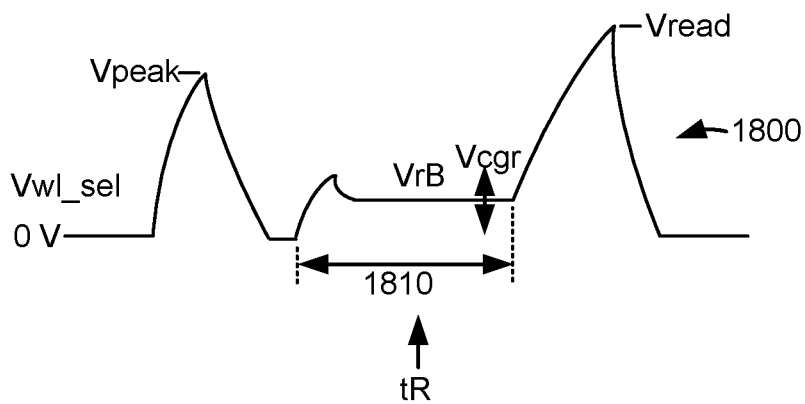
FIG. 18 depicts a voltage signal for a selected word line, consistent with Example 2 in FIGS. 14A and 14B.

FIG. 18 depicts a voltage signal for a selected word line, consistent with Example 2 in FIGS. 14A and 14B. The voltage signal 1800 includes a pre-read voltage spike from 0 V to Vpeak. After the spike is applied, the voltage transitions to Vcgr in a range encompassing VrB with an over kick and the memory cells are sensed relative to Vcgr at a read time, tR in a time period 1810.

Figure 19:
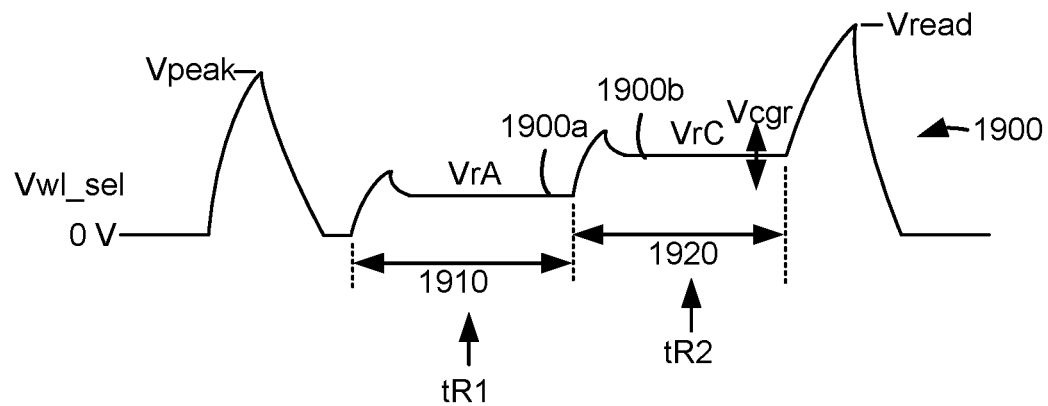
FIG. 19 depicts a voltage signal for a selected word line, consistent with Example 3 in FIGS. 14A and 14B.

FIG. 19 depicts a voltage signal for a selected word line, consistent with Example 3 in FIGS. 14A and 14B. The voltage signal 1900 includes a pre-read voltage spike from 0 V to Vpeak. After the spike is applied, the voltage transitions to VrA with an over kick in a time period 1910, then to Vcgr in a range encompassing VrC with an over kick in a time period 1920. The memory cells are sensed relative to VrA and Vcgr at tR1 and tR2, respectively. This is an example of an increasing voltage signal or an increasing staircase voltage having two steps. A portion 1900a of the voltage signal 1900, in the time period 1910, is a dummy read voltage and a portion 1900b in the time period 1920 is a read voltage used to obtain the Vth distribution.

Figure 20:
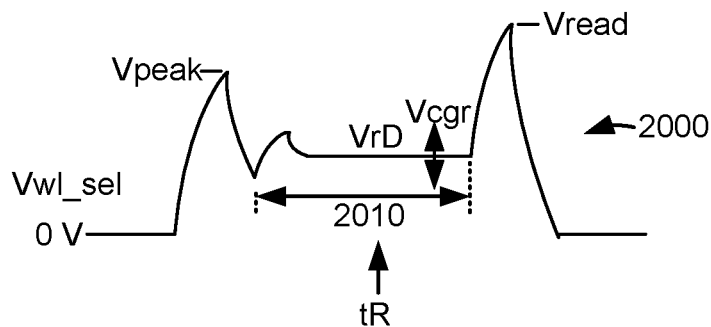
FIG. 20 depicts a voltage signal for a selected word line, consistent with Example 4 in FIGS. 14A and 14B.

FIG. 20 depicts a voltage signal for a selected word line, consistent with Example 4 in FIGS. 14A and 14B. The voltage signal 2000 includes a pre-read voltage spike. After the spike is applied, the voltage transitions to Vcgr in a range encompassing VrD with an over kick and the memory cells are sensed relative to Vcgr at a read time, tR in a time period 2010.

Figure 21:
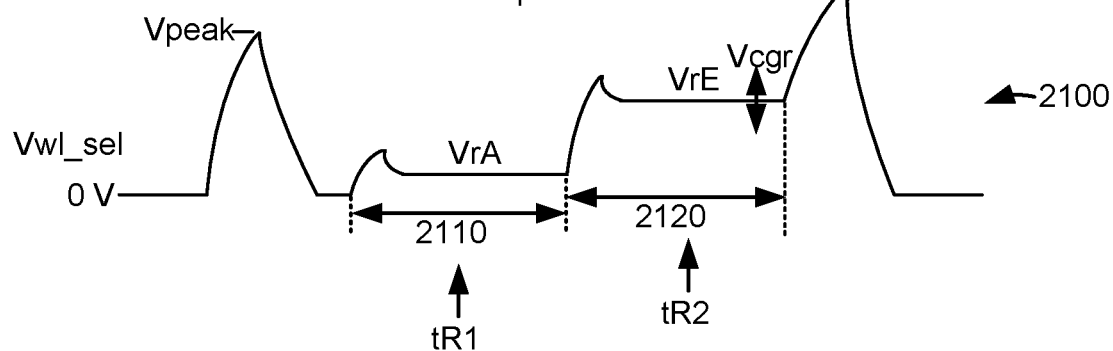
FIG. 21 depicts a voltage signal for a selected word line, consistent with Example 5 in FIGS. 14A and 14B.

FIG. 21 depicts a voltage signal for a selected word line, consistent with Example 5 in FIGS. 14A and 14B. The voltage signal 2100 includes a pre-read voltage spike. After the spike is applied, the voltage transitions to VrA with an over kick in a time period 2110, then to Vcgr in a range encompassing VrE with an over kick in a time period 2120. The memory cells are sensed relative to VrA and Vcgr at tR1 and tR2, respectively. A portion of the voltage signal in the time period 2110 is a dummy read voltage and a portion in the time period 2120 is a read voltage used to obtain the Vth distribution.

Figure 22:
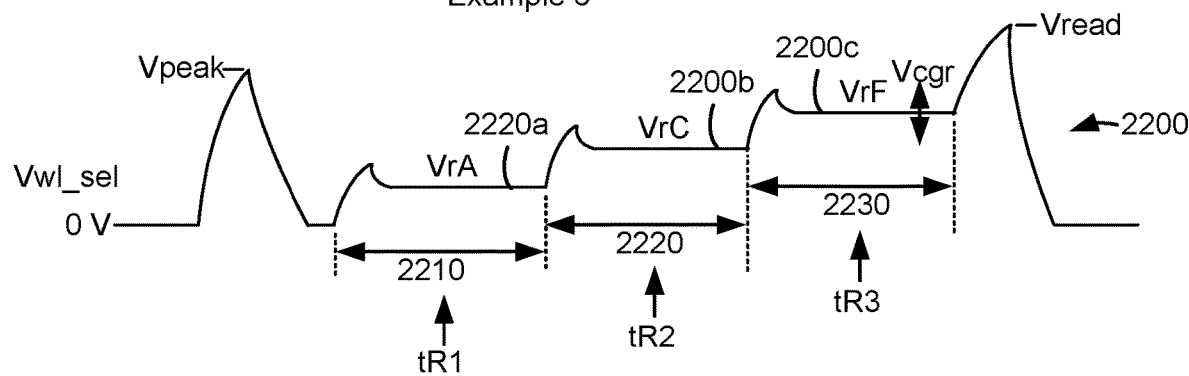
FIG. 22 depicts a voltage signal for a selected word line, consistent with Example 6 in FIGS. 14A and 14B.

FIG. 22 depicts a voltage signal for a selected word line, consistent with Example 6 in FIGS. 14A and 14B. The voltage signal 2200 includes a pre-read voltage spike. After the spike is applied, the voltage transitions to VrA with an over kick in a time period 2210, then to VrC with an over kick in a time period 2220, then to Vcgr in a range encompassing VrF with an over kick in a time period 2230. The memory cells are sensed relative to VrA, VrC and Vcgr at tR1, tR2 and tR3, respectively. This is an example of an increasing voltage signal or an increasing staircase voltage having three steps. A portion 2200a of the voltage signal in the time period 2210 is a first dummy read voltage, a portion 2200b in the time period 2220 is a second dummy read voltage, and a portion 2200c in the time period 2230 is a read voltage used to obtain the Vth distribution.

Figure 23:
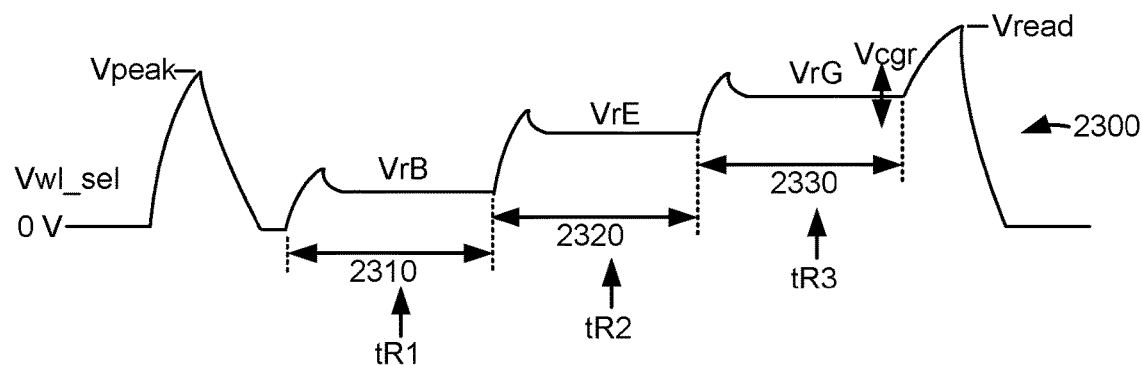
FIG. 23 depicts a voltage signal for a selected word line, consistent with Example 7 in FIGS. 14A and 14B.

FIG. 23 depicts a voltage signal for a selected word line, consistent with Example 7 in FIGS. 14A and 14B. The voltage signal 2300 includes a pre-read voltage spike. After the spike is applied, the voltage transitions to VrB with an over kick in a time period 2310, then to VrE with an over kick in a time period 2320, then to Vcgr in a range encompassing VrG with an over kick in a time period 2330. The memory cells are sensed relative to VrB, VrE and Vcgr at tR1, tR2 and tR3, respectively. A portion of the voltage signal in the time period 2310 is a first dummy read voltage, a portion in the time period 2320 is a second dummy read voltage, and a portion in the time period 2330 is a read voltage used to obtain the Vth distribution.

Figure 24:
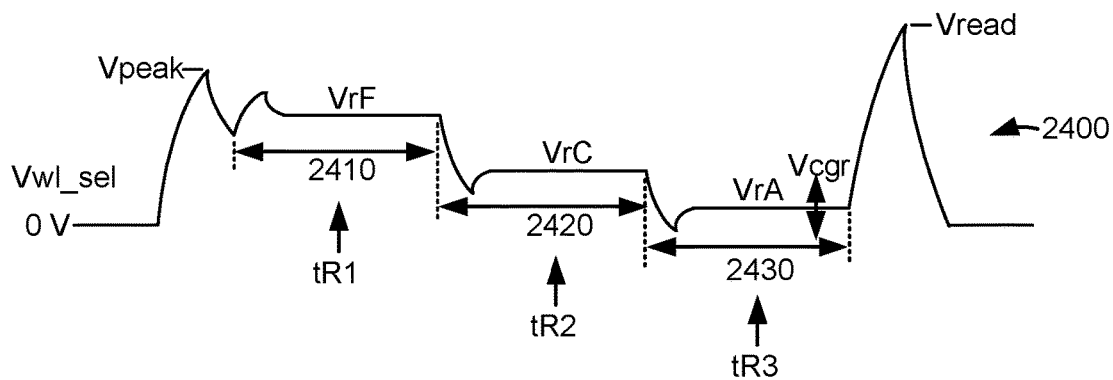
FIG. 24 depicts a voltage signal for a selected word line, consistent with Example 8 in FIGS. 14A and 14B.

FIG. 24 depicts a voltage signal for a selected word line, consistent with Example 8 in FIGS. 14A and 14B. The voltage signal 2400 includes a pre-read voltage spike. After the spike is applied, the voltage transitions to VrF with an over kick in a time period 2410, then to VrC with an under kick in a time period 2420, then to Vcgr in a range encompassing VrA with an under kick in a time period 2430. The memory cells are sensed relative to VrF, VrC and Vcgr at tR1, tR2 and tR3, respectively. This is an example of a decreasing voltage signal or a decreasing staircase voltage having three steps. A portion of the voltage signal in the time period 2410 is a first dummy read voltage, a portion in the time period 2420 is a second dummy read voltage, and a portion in the time period 2430 is a read voltage used to obtain the Vth distribution.

Figure 25:
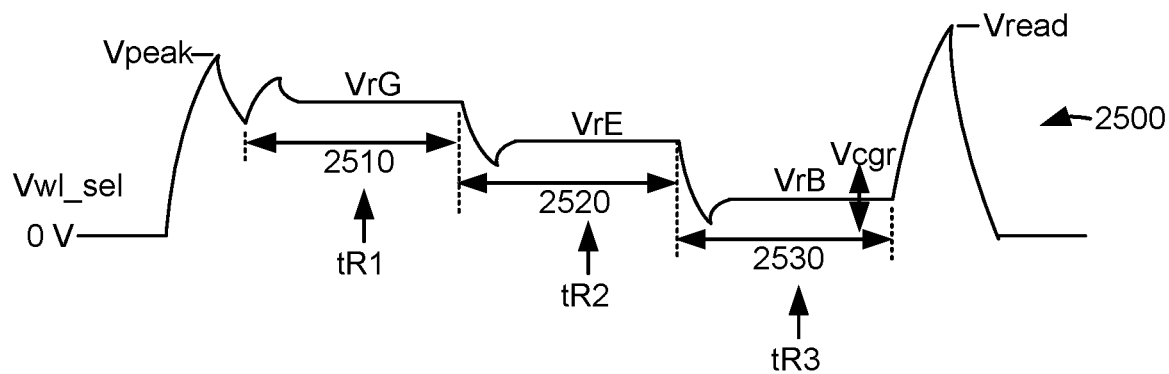
FIG. 25 depicts a voltage signal for a selected word line, consistent with Example 9 in FIGS. 14A and 14B.

FIG. 25 depicts a voltage signal for a selected word line, consistent with Example 9 in FIGS. 14A and 14B. The voltage signal 2500 includes a pre-read voltage spike. After the spike is applied, the voltage transitions to VrG with an over kick in a time period 2510, then to VrE with an under kick in a time period 2520, then to Vcgr in a range encompassing VrB with an under kick in a time period 2530. The memory cells are sensed relative to VrG, VrE and Vcgr at tR1, tR2 and tR3, respectively. A portion of the voltage signal in the time period 2510 is a first dummy read voltage, a portion in the time period 2520 is a second dummy read voltage, and a portion in the time period 2530 is a read voltage used to obtain the Vth distribution.

Figure 26:
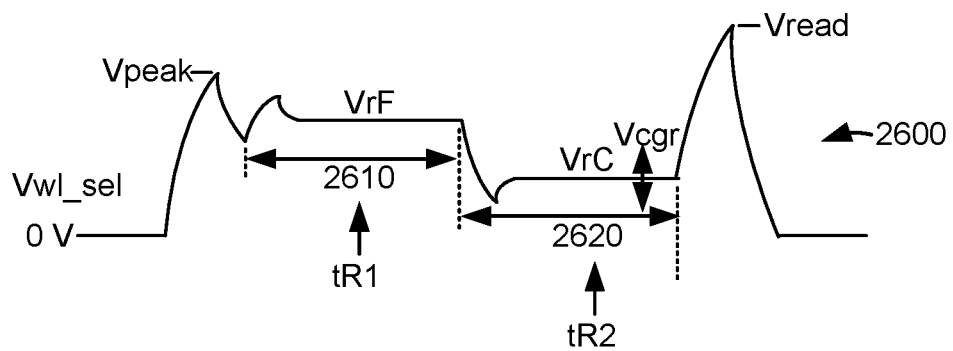
FIG. 26 depicts a voltage signal for a selected word line, consistent with Example 10 in FIGS. 14A and 14B.

FIG. 26 depicts a voltage signal for a selected word line, consistent with Example 10 in FIGS. 14A and 14B. The voltage signal 2600 includes a pre-read voltage spike. After the spike is applied, the voltage transitions to VrF with an over kick in a time period 2610, then to Vcgr in a range encompassing VrC with an under kick in a time period 2620. The memory cells are sensed relative to VrF and Vcgr at tR1 and tR2, respectively. This is an example of a decreasing voltage signal or a decreasing staircase voltage having two steps. A portion of the voltage signal in the time period 2610 is a first dummy read voltage, and a portion in the time period 2620 is a read voltage used to obtain the Vth distribution.

Figure 27:
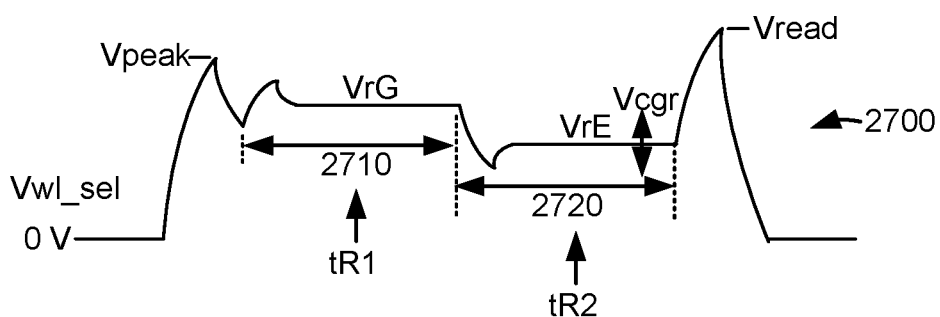
FIG. 27 depicts a voltage signal for a selected word line, consistent with Example 11 in FIGS. 14A and 14B.

FIG. 27 depicts a voltage signal for a selected word line, consistent with Example 11 in FIGS. 14A and 14B. The voltage signal 2700 includes a pre-read voltage spike. After the spike is applied, the voltage transitions to VrG with an over kick in a time period 2710, then to Vcgr in a range encompassing VrE with an under kick in a time period 2720. The memory cells are sensed relative to VrG and Vcgr at tR1 and tR2, respectively. A portion of the voltage signal in the time period 2710 is a first dummy read voltage, and a portion in the time period 2720 is a read voltage used to obtain the Vth distribution.

Figure 28:
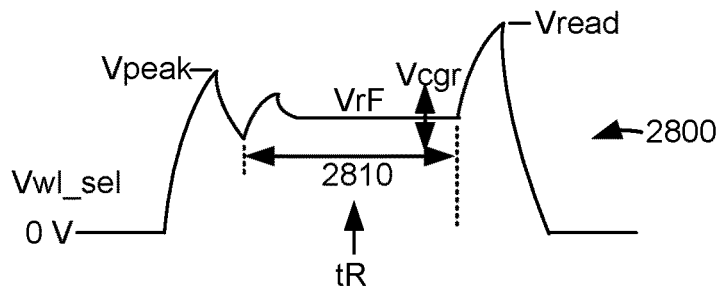
FIG. 28 depicts a voltage signal for a selected word line, consistent with Example 12 in FIGS. 14A and 14B.

FIG. 28 depicts a voltage signal for a selected word line, consistent with Example 12 in FIGS. 14A and 14B. The voltage signal 2800 includes a pre-read voltage spike. After the spike is applied, the voltage transitions to Vcgr in a range encompassing VrF with an over kick and the memory cells are sensed relative to Vcgr at a read time, tR in a time period 2810.

Figure 29:
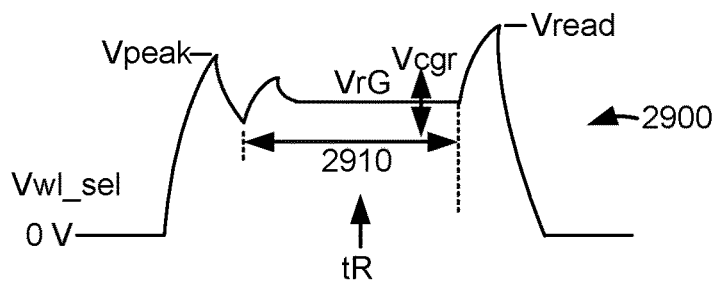
FIG. 29 depicts a voltage signal for a selected word line, consistent with Example 13 in FIGS. 14A and 14B.

FIG. 29 depicts a voltage signal for a selected word line, consistent with Example 13 in FIGS. 14A and 14B. The voltage signal 2900 includes a pre-read voltage spike. After the spike is applied, the voltage transitions to Vcgr in a range encompassing VrG with an over kick and the memory cells are sensed relative to Vcgr at a read time, tR in a time period 2910.

Figure 30:
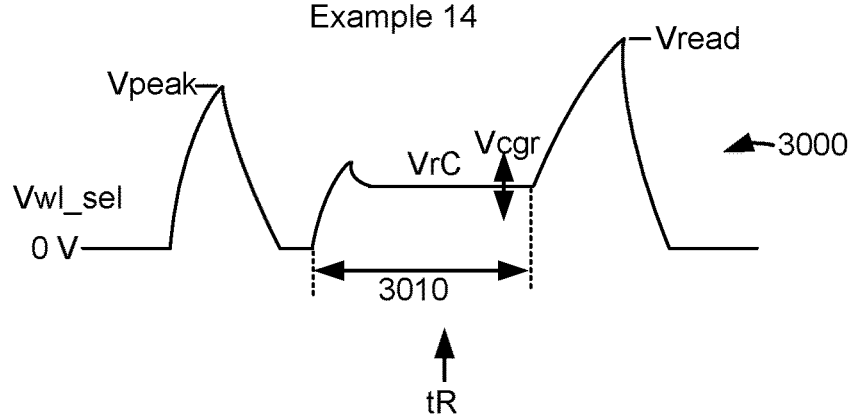
FIG. 30 depicts a voltage signal for a selected word line, consistent with Example 14 in FIGS. 14A and 14B.

FIG. 30 depicts a voltage signal for a selected word line, consistent with Example 14 in FIGS. 14A and 14B. The voltage signal 3000 includes a pre-read voltage spike. After the spike is applied, the voltage transitions to Vcgr in a range encompassing VrC with an over kick and the memory cells are sensed relative to Vcgr at a read time, tR in a time period 3010.

Figure 31:
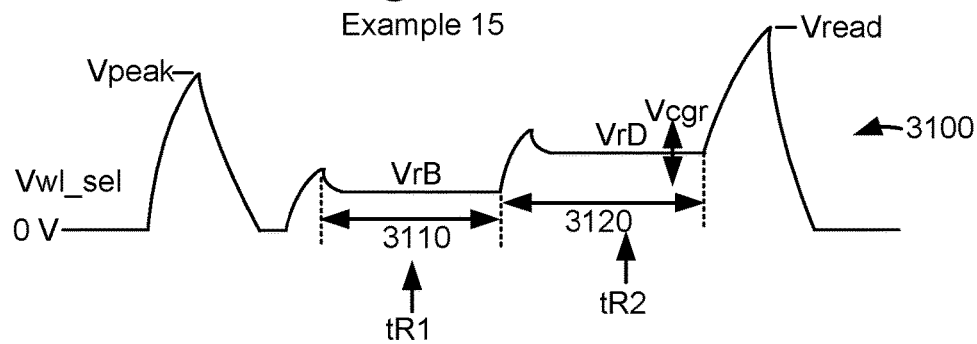
FIG. 31 depicts a voltage signal for a selected word line, consistent with Example 15 in FIGS. 14A and 14B.

FIG. 31 depicts a voltage signal for a selected word line, consistent with Example 15 in FIGS. 14A and 14B. The voltage signal 3100 includes a pre-read voltage spike. After the spike is applied, the voltage transitions to VrB with an over kick in a time period 3110, then to Vcgr in a range encompassing VrD with an over kick in a time period 3120. The memory cells are sensed relative to VrB and Vcgr at tR1 and tR2, respectively. A portion of the voltage signal in the time period 3110 is a first dummy read voltage, and a portion in the time period 3120 is a read voltage used to obtain the Vth distribution.

Figure 32:
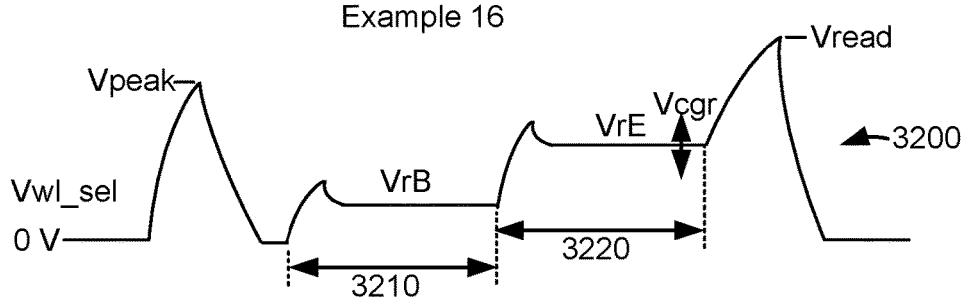
FIG. 32 depicts a voltage signal for a selected word line, consistent with Example 16 in FIGS. 14A and 14B.

FIG. 32 depicts a voltage signal for a selected word line, consistent with Example 16 in FIGS. 14A and 14B. The voltage signal 3200 includes a pre-read voltage spike. After the spike is applied, the voltage transitions to VrB with an over kick in a time period 3210, then to Vcgr in a range encompassing VrE with an over kick in a time period 3220. The memory cells are sensed relative to VrB and Vcgr at tR1 and tR2, respectively. A portion of the voltage signal in the time period 3210 is a first dummy read voltage, and a portion in the time period 3220 is a read voltage used to obtain the Vth distribution.

Figure 33:
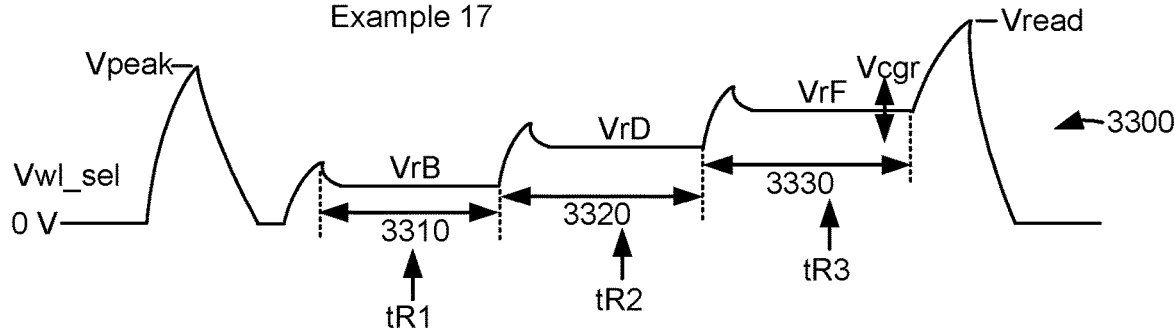
FIG. 33 depicts a voltage signal for a selected word line, consistent with Example 17 in FIGS. 14A and 14B.

FIG. 33 depicts a voltage signal for a selected word line, consistent with Example 17 in FIGS. 14A and 14B. The voltage signal 3300 includes a pre-read voltage spike. After the spike is applied, the voltage transitions to VrB with an over kick in a time period 3310, then to VrD with an over kick in a time period 3320, then to Vcgr in a range encompassing VrF with an over kick in a time period 3330. The memory cells are sensed relative to VrB, VrD and Vcgr at tR1, tR2 and tR3, respectively. A portion of the voltage signal in the time period 3310 is a first dummy read voltage, a portion in the time period 3320 is a second dummy read voltage, and a portion in the time period 3330 is a read voltage used to obtain the Vth distribution.

Figure 34:
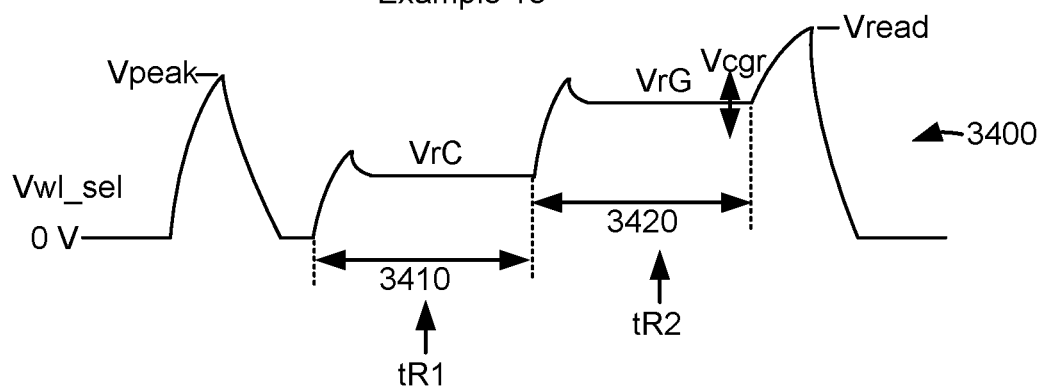
FIG. 34 depicts a voltage signal for a selected word line, consistent with Example 18 in FIGS. 14A and 14B.

FIG. 34 depicts a voltage signal for a selected word line, consistent with Example 18 in FIGS. 14A and 14B. The voltage signal 3400 includes a pre-read voltage spike. After the spike is applied, the voltage transitions to VrC with an over kick in a time period 3410, then to Vcgr in a range encompassing VrG with an over kick in a time period 3420. The memory cells are sensed relative to VrC and Vcgr at tR1 and tR2, respectively. A portion of the voltage signal in the time period 3410 is a first dummy read voltage, and a portion in the time period 3420 is a read voltage used to obtain the Vth distribution.

Figure 35:
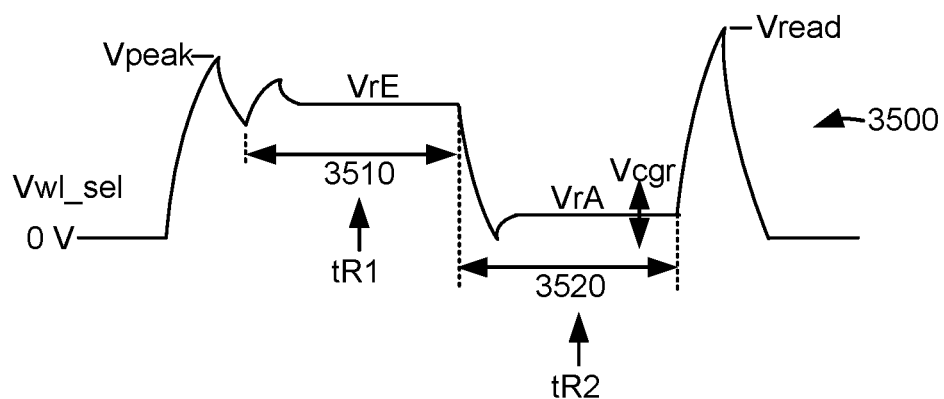
FIG. 35 depicts a voltage signal for a selected word line, consistent with Example 19 in FIGS. 14A and 14B.

FIG. 35 depicts a voltage signal for a selected word line, consistent with Example 19 in FIGS. 14A and 14B. The voltage signal 3500 includes a pre-read voltage spike. After the spike is applied, the voltage transitions to VrE with an over kick in a time period 3510, then to Vcgr in a range encompassing VrA with an under kick in a time period 3520. The memory cells are sensed relative to VrE and Vcgr at tR1 and tR2, respectively. A portion of the voltage signal in the time period 3510 is a first dummy read voltage, and a portion in the time period 3520 is a read voltage used to obtain the Vth distribution.

Figure 36:
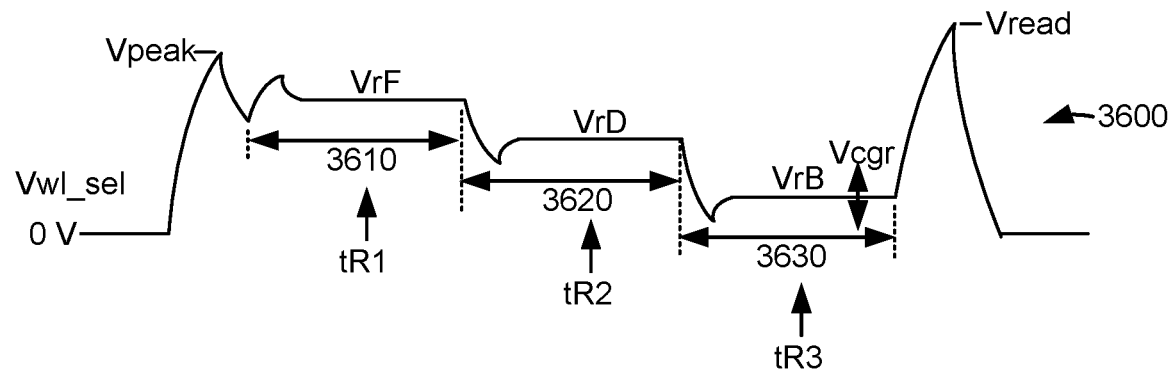
FIG. 36 depicts a voltage signal for a selected word line, consistent with Example 20 in FIGS. 14A and 14B.

FIG. 36 depicts a voltage signal for a selected word line, consistent with Example 20 in FIGS. 14A and 14B. The voltage signal 3600 includes a pre-read voltage spike. After the spike is applied, the voltage transitions to VrF with an over kick in a time period 3610, then to VrD with an under kick in a time period 3620, then to Vcgr in a range encompassing VrB with an under kick in a time period 3630. The memory cells are sensed relative to VrF, VrD and Vcgr at tR1, tR2 and tR3, respectively. A portion of the voltage signal in the time period 3610 is a first dummy read voltage, a portion in the time period 3620 is a second dummy read voltage, and a portion in the time period 3630 is a read voltage used to obtain the Vth distribution.

Figure 37:
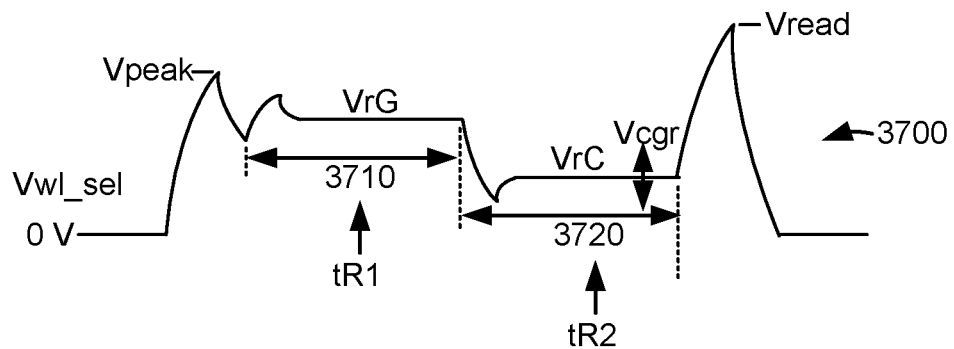
FIG. 37 depicts a voltage signal for a selected word line, consistent with Example 21 in FIGS. 14A and 14B.

FIG. 37 depicts a voltage signal for a selected word line, consistent with Example 21 in FIGS. 14A and 14B. The voltage signal 3700 includes a pre-read voltage spike. After the spike is applied, the voltage transitions to VrG with an over kick in a time period 3710, then to Vcgr in a range encompassing VrC with an under kick in a time period 3720. The memory cells are sensed relative to VrG and Vcgr at tR1 and tR2, respectively. A portion of the voltage signal in the time period 3710 is a first dummy read voltage, and a portion in the time period 3720 is a read voltage used to obtain the Vth distribution.

Figure 38:
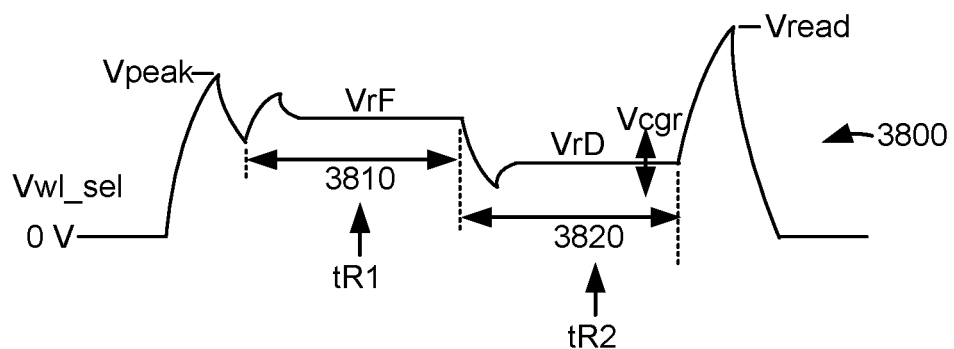
FIG. 38 depicts a voltage signal for a selected word line, consistent with Example 22 in FIGS. 14A and 14B.

FIG. 38 depicts a voltage signal for a selected word line, consistent with Example 22 in FIGS. 14A and 14B. The voltage signal 3800 includes a pre-read voltage spike. After the spike is applied, the voltage transitions to VrF with an over kick in a time period 3810, then to Vcgr in a range encompassing VrD with an under kick in a time period 3820. The memory cells are sensed relative to VrF and Vcgr at tR1 and tR2, respectively. A portion of the voltage signal in the time period 3810 is a first dummy read voltage, and a portion in the time period 3820 is a read voltage used to obtain the Vth distribution.

Figure 39:
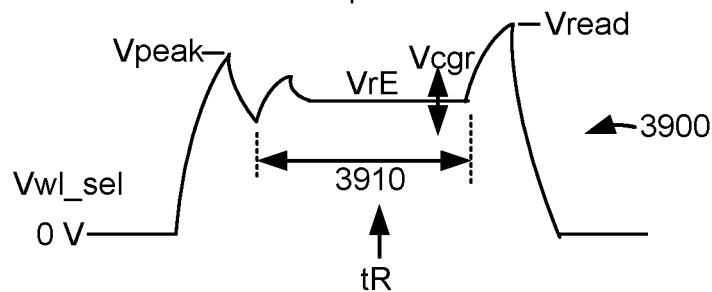
FIG. 39 depicts a voltage signal for a selected word line, consistent with Example 23 in FIGS. 14A and 14B.

FIG. 39 depicts a voltage signal for a selected word line, consistent with Example 23 in FIGS. 14A and 14B. The voltage signal 3900 includes a pre-read voltage spike. After the spike is applied, the voltage transitions to Vcgr in a range encompassing VrE with an over kick and the memory cells are sensed relative to VrE at a read time, tR in a time period 3910.

Accordingly, it can be seen that in one implementation, an apparatus comprises: a control circuit configured to connect to a set of memory cells to measure a threshold voltage distribution of the set of memory cells. The control circuit is configured to: perform a plurality of read operations of the set of memory cells, each read operation reads the set of memory cells with a respective read voltage of a respective voltage signal, the respective read voltages extend in a plurality of voltage ranges, and each respective voltage signal has a type based on a voltage range of the plurality of voltage ranges that encompasses the respective read voltage.

In another implementation, a method comprises: reading a set of memory cells with read voltages in a first voltage range, each read voltage of the first voltage range is in a respective voltage signal; and reading the set of memory cells with read voltages in a second voltage range, different than the first voltage range, each read voltage of the second voltage range is in a respective voltage signal, wherein a number of dummy read voltages before the read voltages in the respective voltage signals of the first voltage range is different than a number of dummy read voltages before the read voltages in the respective voltage signals of the second voltage range.

In another implementation, an apparatus comprises: a control circuit configured to connect to a set of memory cells; and a memory interface connected to the control circuit. The control circuit is configured to issue a command via the memory interface to: for each read voltage of a plurality of read voltages, determine a type of a respective voltage signal which comprises the read voltage among a plurality of available types of voltage signals based on a voltage range which encompasses the read voltage; and apply the respective voltage signals which comprise the read voltages to the set of memory cells to obtain a threshold voltage distribution of the set of memory cells.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells to measure a threshold voltage distribution of the set of memory cells, the control circuit is configured to:
perform a plurality of read operations of the set of memory cells, each read operation reads the set of memory cells with a respective read voltage of a respective voltage signal, the respective read voltages extend in a plurality of voltage ranges with each voltage range encompassing a corresponding data state demarcation voltage of a user read mode, each respective voltage signal has a type based on a voltage range of the plurality of voltage ranges that encompasses the respective read voltage and for each respective voltage signal, the type is based on a number of data state demarcation voltages which precede the corresponding data state demarcation voltage in the user read.

2. The apparatus of claim 1, wherein:
each voltage range encompasses a corresponding data state demarcation voltage of a user read mode; and when the corresponding data state demarcation voltage is preceded by a number of preceding data state demarcation voltage in the user read mode, the respective voltage signal comprises a number of dummy read voltages corresponding to the number of preceding data state demarcation voltages.

3. The apparatus of claim 2, wherein:
the dummy read voltages correspond to the preceding data state demarcation voltages in duration and magnitude.

4. The apparatus of claim 1, wherein:
each voltage range encompasses a corresponding data state demarcation voltage of a user read mode; and
each respective voltage signal comprises an increasing staircase voltage when the user read mode comprises an increasing staircase voltage, and a decreasing staircase voltage when the user read mode comprises a decreasing staircase voltage.

5. The apparatus of claim 1, wherein: the control circuit is further configured to determine the type of each respective voltage signal by accessing a lookup table.

6. The apparatus of claim 1, wherein:
the corresponding data state demarcation voltage is a single data state demarcation voltage in the user read mode; and
the type of the respective voltage signal comprises zero dummy read voltages.

7. The apparatus of claim 1, wherein:
the corresponding data state demarcation voltage is a first data state demarcation voltage among multiple data state demarcation voltages in the user read mode; and
the type of the respective voltage signal comprises zero dummy read voltages.

8. The apparatus of claim 1, wherein:
the corresponding data state demarcation voltage is a second data state demarcation voltage which follows a first data state demarcation voltage in the user read mode; and
the type of the respective voltage signal comprises a single dummy read voltage corresponding to the first data state demarcation voltage.

9. The apparatus of claim 1, wherein:
the corresponding data state demarcation voltage is a third data state demarcation which follows first and second data state demarcation voltages in the user read mode; and
the type of the respective voltage signal comprises first and second dummy read voltages corresponding to the first and second data state demarcation voltages, respectively.

10. The apparatus of claim 1, wherein:
the respective read voltages extend in a plurality of adjacent voltage ranges.

11. A method, comprising:
reading a set of memory cells with read voltages in a first voltage range, each read voltage of the first voltage range is in a respective voltage signal; and
reading the set of memory cells with read voltages in a second voltage range, different than the first voltage range, each read voltage of the second voltage range is in a respective voltage signal, wherein a number of dummy read voltages before the read voltages in the respective voltage signals of the first voltage range is different than a number of dummy read voltages before the read voltages in the respective voltage signals of the second voltage range.

12. The method of claim 11, further comprising:
obtaining a threshold voltage distribution of the set of memory cells based on the reading of the set of memory cells with the read voltages in the first voltage range and the reading of the set of memory cells with the read voltages in the second voltage range.

13. The method of claim 12, further comprising:
separate from the obtaining of the threshold voltage distribution, in a user read mode, reading a page of a data from the set of memory cells using a corresponding data state demarcation voltage in the first voltage range and a number of preceding data state demarcation voltages, wherein the number of dummy read voltages in each respective voltage signal comprising the read voltages in the first voltage range is equal to the number of preceding data state demarcation voltages.

14. The method of claim 11, wherein:
sensing operations are not performed for the set of memory cells when the dummy read voltages are applied to the set of memory cells.

15. The method of claim 11, further comprising:
performing sensing operations for the set of memory cells during the dummy read voltages; and
discarding results from the sensing operations.

16. An apparatus, comprising:
a control circuit configured to connect to a set of memory cells; and
a memory interface connected to the control circuit, the control circuit is configured to issue a command via the memory interface to:
for each read voltage of a plurality of read voltages, determine a type of a respective voltage signal which comprises the read voltage among a plurality of available types of voltage signals based on a voltage range which encompasses the read voltage, the type of the respective voltage signal determined by accessing a lookup table based on the voltage range which encompasses the read voltage; and
apply the respective voltage signals which comprise the read voltages to the set of memory cells to obtain a threshold voltage distribution of the set of memory cells.

17. The apparatus of claim 16, wherein:
one or more of the respective voltage signals comprise one or more dummy read voltages.

18. The apparatus of claim 16, wherein:
the user read mode indicates whether an increasing read order or a decreasing read order is used; and
for each respective voltage signal, the type of the respective voltage signal comprises an increasing staircase voltage when the increasing read order is used and a decreasing staircase voltage when the decreasing read order is used.

19. The apparatus of claim 16, wherein:
the user read mode comprises a 1-3-3 page coding or a 2-3-2 page coding;
the 1-3-3 page coding comprises a single data state demarcation voltage in a lower page read, three data state demarcation voltages in a middle page read, and three data state demarcation voltages in an upper page read; and
the 2-3-2 page coding comprises two data state demarcation voltages in a lower page read, three data state demarcation voltages in a middle page read, and two data state demarcation voltages in an upper page read.

20. The apparatus of claim 16, wherein:
the set of memory cells are configured as MLC, TLC, QLC, PLC or HLC cells.

\* \* \* \* \*